(12) United States Patent
Sakata et al.

(10) Patent No.: US 10,692,751 B2
(45) Date of Patent: Jun. 23, 2020

(54) METHOD OF MANUFACTURING SEMICONDUCTOR DEVICE

(71) Applicant: FUJI ELECTRIC CO., LTD., Kawasaki-shi, Kanagawa (JP)

(72) Inventors: Toshiaki Sakata, Matsumoto (JP); Takeyoshi Nishimura, Matsumoto (JP); Isamu Sugai, Matsumoto (JP); Kazuya Yamaguchi, Matsumoto (JP)

(73) Assignee: FUJI ELECTRIC CO., LTD., Kawasaki-shi, Kanagawa (JP)

( * ) Notice: Subject to any disclaimer, the term of this patent is extended or adjusted under 35 U.S.C. 154(b) by 0 days.

(21) Appl. No.: 16/366,529

(22) Filed: Mar. 27, 2019

(65) Prior Publication Data

US 2019/0348318 A1 Nov. 14, 2019

(30) Foreign Application Priority Data

May 11, 2018 (JP) ................................. 2018-092594

(51) Int. Cl.

| | |
|---|---|
| *H01L 21/761* | (2006.01) |
| *H01L 21/265* | (2006.01) |
| *H01L 21/266* | (2006.01) |
| *H01L 21/225* | (2006.01) |
| *H01L 29/06* | (2006.01) |
| *H01L 21/3065* | (2006.01) |

(Continued)

(52) U.S. Cl.
CPC ...... *H01L 21/761* (2013.01); *H01L 21/02532* (2013.01); *H01L 21/02573* (2013.01); *H01L 21/2253* (2013.01); *H01L 21/266* (2013.01); *H01L 21/26513* (2013.01); *H01L 21/3065* (2013.01); *H01L 21/324* (2013.01); *H01L 29/0634* (2013.01)

(58) Field of Classification Search
CPC ............. H01L 21/761; H01L 21/02532; H01L 21/02573; H01L 21/2253; H01L 21/26513; H01L 21/266; H01L 21/3065; H01L 21/324
See application file for complete search history.

(56) References Cited

U.S. PATENT DOCUMENTS

2008/0303114 A1 12/2008 Shibata et al.

FOREIGN PATENT DOCUMENTS

| JP | 2003-264286 A | 9/2003 |
|---|---|---|
| JP | 2008-305927 A | 12/2008 |

(Continued)

*Primary Examiner* — Matthew L Reames
(74) *Attorney, Agent, or Firm* — Rabin & Berdo, P.C.

(57) ABSTRACT

In each n-type epitaxial layer, p-type impurity regions are respectively formed by performing for each stacking of an n-type epitaxial layer, ion implantation using a resist mask. In a first n-type epitaxial layer, a p-type impurity region is formed at an inner wall of an impurity diffusion trench formed by dry etching. In a second and third n-type epitaxial layer, p-type impurity regions are formed respectively at an inner wall of impurity diffusion trenches that are recesses respectively corresponding to the impurity diffusion trenches of the first and the second n-type epitaxial layers respectively therebelow. The resist mask has an opening width that is wider than widths of open ends of the impurity diffusion trenches. The p-type impurity regions are connected by thermal diffusion processing, thereby forming a parallel pn layer constituted by p-type regions having a high aspect ratio and n-type regions respectively between the p-type regions.

7 Claims, 26 Drawing Sheets

(51) Int. Cl.
*H01L 21/02* (2006.01)
*H01L 21/324* (2006.01)

(56) References Cited

FOREIGN PATENT DOCUMENTS

| | | |
|---|---|---|
| JP | 2011-176157 A | 9/2011 |
| JP | 2012-169577 A | 9/2012 |

METHOD OF MANUFACTURING SEMICONDUCTOR DEVICE

CROSS REFERENCE TO RELATED APPLICATIONS

This application is based upon and claims the benefit of priority of the prior Japanese Patent Application No. 2018-092594, filed on May 11, 2018, the entire contents of which are incorporated herein by reference.

BACKGROUND OF THE INVENTION

1. Field of the Invention

Embodiments of the invention relate to a method of manufacturing a semiconductor device.

2. Description of the Related Art

Conventionally, a super junction (SJ) semiconductor device is known that has, as a drift layer, a parallel pn layer in which an n-type region and a p-type region with increased impurity concentrations are disposed to repeatedly alternate along a direction (hereinafter, lateral direction) that is parallel to a main surface of a semiconductor substrate. As a method of forming the parallel pn layer of this super junction semiconductor device, a multistage epitaxial method, a trench filling epitaxial method, etc. are known.

In the multistage epitaxial method, epitaxial growth of an n-type epitaxial layer constituting the n-type regions of the parallel pn layer and ion implantation for forming the p-type regions of the parallel pn layer are repeatedly performed alternately. Further, the p-type impurity is diffused by heat, thereby forming the p-type regions that extend vertically along a depth direction (hereinafter, longitudinal direction), the p-type regions being formed spanning the n-type epitaxial layers that are stacked in multiple stages, whereby the parallel pn layer is formed (for example, refer to Japanese Laid-Open Patent Publication No. 2012-169577, Japanese Laid-Open Patent Publication No. 2003-264286).

In the trench filling epitaxial method, an n-type epitaxial layer constituting the n-type regions of the parallel pn layer is formed by epitaxial growth and trenches are formed in the n-type epitaxial layer. Further, on the n-type epitaxial layer that includes the insides of the trenches, a p-type epitaxial layer constituting the p-type regions of the parallel pn layer is formed and the insides of the trenches are filled with the p-type epitaxial layer, whereby the parallel pn layer is formed (for example, refer to Japanese Laid-Open Patent Publication No. 2008-305927, Japanese Laid-Open Patent Publication No. 2011-176157).

When the super junction semiconductor device is structured to improve a tradeoff relationship between breakdown voltage (withstand voltage) and ON resistance, a repeat pitch of the p-type regions of the parallel pn layer in the lateral direction has to be reduced and the p-type regions of the parallel pn layer have to have a long cross-sectional shape along the longitudinal direction. Therefore, p-type regions having a high aspect ratio (=thickness/width) of 2 or more may be formed. The breakdown voltage is a voltage limit at which no errant operation or destruction of an element occurs.

As a method of forming a p-type region having a high aspect ratio by the multistage epitaxial method, a thickness of a single n-type epitaxial layer formed in multistage epitaxial growth is reduced. Additionally, an opening width of a resist mask used in ion implantation of a p-type impurity is reduced, the ion implantation of the p-type impurity being performed with each epitaxial growth of an n-type epitaxial layer. Further, a method of diffusing the p-type impurity diffusion by heat treatment is known (hereinafter, first conventional method).

A method of forming the parallel pn layer by the first conventional method described above will be described in detail. FIGS. 19, 20, 21, 22, and 23 are cross-sectional views of the parallel pn layer during formation by the first conventional method. First, as depicted in FIG. 19, an n-type epitaxial layer 101 is grown on an $n^+$-type starting substrate (semiconductor wafer) 110. Reference numeral 111 is a device region constituting a semiconductor chip. Reference numeral 121 is a trench that is used for an alignment mark and formed at an arbitrary timing at a scribe line 112.

Next, by photolithography and etching, a resist mask 131 having opened portions that correspond to formation regions of a p-type region 152 (refer to FIG. 23) of a parallel pn layer 150 is formed on a surface of the n-type epitaxial layer 101. Next, using the resist mask 131 as a mask, an ion implantation 132 of a p-type impurity such as boron (B) is performed, whereby in a surface layer of the n-type epitaxial layer 101, a p-type impurity region 141 is selectively formed. Next, as depicted in FIG. 20, after the resist mask 131 is removed, an n-type epitaxial layer 102 is formed by epitaxial growth on the n-type epitaxial layer 101.

Next, as depicted in FIG. 21, a process including formation of a resist mask, ion implantation of a p-type impurity and n-type epitaxial growth of an n-type epitaxial layer as one set is repeatedly performed. As a result, the n-type epitaxial layers 102, 103 are formed in which p-type impurity regions 142, 143 are formed at portions corresponding formation regions of the p-type region 152 of the parallel pn layer 150. Additionally, as depicted in FIG. 22, an n-type epitaxial layer 104 in which no p-type impurity region is formed is stacked as an outermost surface layer.

In FIG. 21, a state is depicted in which a resist mask 133 having opened portions that correspond to formation regions of the p-type region 152 of the parallel pn layer 150 is used as a mask in an ion implantation 134 of a p-type impurity, whereby a p-type impurity region 143 is selectively formed in a surface layer of the n-type epitaxial layer 103 that is the outermost surface layer. In other words, the n-type epitaxial layers 101 to 103 are each formed by one stage of epitaxial growth and for each stage of epitaxial growth, ion implantation of a p-type impurity is performed one time using a resist mask as a mask.

In FIG. 22, a state is depicted in which after the resist mask 133 is removed, the n-type epitaxial layer 104 is further formed on the n-type epitaxial layer 103 by epitaxial growth. By the processes up to here, a semiconductor substrate 105 is fabricated in which the n-type epitaxial layers 101 to 104 are sequentially stacked on the $n^+$-type starting substrate 110. With stacking of each of the n-type epitaxial layers 102 to 104, the trenches 122 to 124 respectively corresponding to recesses formed by the trenches 121 to 123 of the lower layer are newly formed respectively in surfaces of the n-type epitaxial layers 102 to 104 as alignment marks.

Next, as depicted in FIG. 23, the ion implanted p-type impurity is diffused by heat treatment, whereby the p-type impurity regions 141 to 143 are each extended along the longitudinal direction, thereby forming p-type diffusion regions 141' to 143'. The p-type diffusion regions 141' to 143' contact each other in the longitudinal direction or ends of the p-type diffusion regions 141' to 143' overlap each other in longitudinal direction, whereby the p-type diffusion regions 141' to 143' are connected to each other in longitudinal direction.

The p-type diffusion regions 141' to 143' that are connected to each other in the longitudinal direction constitute the p-type regions 152 of the parallel pn layer 150. Remaining portions of the n-type epitaxial layers 101 to 104, the remaining portions between adjacent p-type regions 152 constitute n-type regions 151 of the parallel pn layer 150. In this manner, the n-type regions 151 and the p-type regions 152 of the parallel pn layer 150 are formed spanning the n-type epitaxial layers 101 to 104 stacked in multiple stages.

The following method (hereinafter, second conventional method) is known as another method of forming a p-type region of a high aspect ratio by the multistage epitaxial method. The second conventional method differs from the first conventional method in that for each epitaxial growth of an n-type epitaxial layer, resist masks are used that are thicker than the resist masks 131, 133 (refer to FIGS. 19, 21) used in the first conventional method and ion implantation of a p-type impurity is performed multiple times using differing accelerating voltages.

A method of forming the parallel pn layer by the second conventional method above will be described in detail. FIGS. 24, 25, 26, 27, and 28 are cross-sectional views of the parallel pn layer during formation by the second conventional method. First, as depicted in FIG. 24, similarly to the first conventional method, the n-type epitaxial layer 101 is grown on the n$^+$-type starting substrate 110. Next, by photolithography and etching, a resist mask 161 having opened portions that correspond to formation regions of a p-type region 182 (refer to FIG. 28) of a parallel pn layer 180 is formed on the surface of the n-type epitaxial layer 101.

Next, using the resist mask 161 as a mask, an ion implantation 162 of a p-type impurity such as boron is performed multiple times using differing accelerating voltages (about 100 keV to 2 MeV), thereby respectively forming multiple p-type impurity regions to differing depths from the surface of the n-type epitaxial layer 101, selectively. For example, a p-type impurity region 171a is selectively formed by a first session of the ion implantation 162, in a portion that is deeper than the surface of the n-type epitaxial layer 101, a p-type impurity region 171b is selectively formed by a second session of the ion implantation 162, in the surface layer of the n-type epitaxial layer 101.

In other words, the first session of the ion implantation 162 is performed using accelerating voltage that is higher than that of the second session of the ion implantation 162. A thickness of the resist mask 161 used in the ion implantation 162 is increased to an extent that the p-type impurity is not introduced into a portion of the n-type epitaxial layer 101, the portion that is covered by the resist mask 161, during the ion implantation 162 using a high accelerating voltage for forming the p-type impurity region 171a in the portion that is deeper than the surface of the n-type epitaxial layer 101.

Next, as depicted in FIG. 25, similarly to the first conventional method, the resist mask 161 is removed, and the n-type epitaxial layer 102 is formed by epitaxial growth on the n-type epitaxial layer 101.

Next, as depicted in FIG. 26, a process including formation of a resist mask and ion implantation of a p-type impurity as one set is repeatedly performed. As a result, the n-type epitaxial layer 102 and the n-type epitaxial layer 103 are stacked, where in the n-type epitaxial layer 102, p-type impurity regions 172a, 172b that differ in depth from the surface are formed at portions that correspond to formation regions of the p-type region 182 of the parallel pn layer 180, and in the n-type epitaxial layer 103, p-type impurity regions 173a, 173b that differ in depth from the surface are formed at portions that correspond to formation regions of the p-type region 182 of the parallel pn layer 180.

In FIG. 26, a state is depicted in which a resist mask 163 having opened portions that correspond to formation regions of the p-type region 182 of the parallel pn layer 180 is used as a mask in an ion implantation 164 of a p-type impurity, whereby in the surface layer of the n-type epitaxial layer 103 that is the outermost surface layer, the p-type impurity regions 172a, 172b are selectively formed to differing depths from the surface of the n-type epitaxial layer 103. In other words, for each stage of epitaxial growth of the n-type epitaxial layers 101 to 103, the ion implantation of a p-type impurity using the resist mask as a mask is performed twice.

Next, as depicted in FIG. 27, similarly to the first conventional method, the resist mask 163 is removed, the n-type epitaxial layer 104 is further formed by epitaxial growth on the n-type epitaxial layer 103, whereby the semiconductor substrate 105 having a predetermined thickness is fabricated. In the second conventional method as well, similarly to the first conventional method, the trenches 121 to 124 are formed as alignment marks in the surfaces of the n-type epitaxial layers 101 to 104, respectively.

Next, as depicted in FIG. 28, the ion implanted p-type impurity is diffused by heat treatment. As a result, the p-type impurity regions 171a, 171b are each extended so as to overlap each other along the longitudinal direction and thereby form p-type diffusion regions 171'. The p-type impurity regions 172a, 172b are each extended so as to overlap each other along the longitudinal direction, whereby p-type diffusion regions 172' are formed. Additionally, the p-type impurity regions 173a, 173b are each extended so as to overlap each other along the longitudinal direction, whereby p-type diffusion regions 173' are formed.

Ends of the p-type diffusion regions 171' to 173' overlap each other along the longitudinal direction, whereby the p-type diffusion regions 171' to 173' are connected to each other along the longitudinal direction. The p-type diffusion regions 171' to 173' connected to each other along the longitudinal direction are the p-type regions 182 of the parallel pn layer 180. Remaining portions of the n-type epitaxial layers 101 to 104, the remaining portions being between adjacent p-type regions 182, are n-type regions 181 of the parallel pn layer 180. As a result, the n-type regions 181 and the p-type regions 182 of the parallel pn layer 180 are formed spanning the n-type epitaxial layers 101 to 104 stacked in multiple stages.

As a method of forming a p-type region having a high aspect ratio by the trench filling epitaxial method, a method of forming trenches with a high aspect ratio is known, the trenches being embedded with a p-type epitaxial layer (hereinafter, third conventional method). Further, a method of repeatedly performing a few times, a process including as one set, epitaxial growth of an n-type epitaxial layer, formation of trenches with a high aspect ratio in the n-type epitaxial layer, and embedding a p-type epitaxial layer in the trenches is also known.

SUMMARY OF THE INVENTION

According to an embodiment of the present invention, a method of manufacturing a semiconductor device having a parallel pn layer in which a first-conductivity-type region and a second-conductivity-type region are disposed to alternate repeatedly, includes forming a plurality of first-conductivity-type epitaxial layers by epitaxial growth and stacking the plurality of first-conductivity-type epitaxial layers on a semiconductor substrate; forming a second-conductivity-type impurity region in each of the plurality of first-conductivity-type epitaxial layers by ion implanting a second-conductivity-type impurity in the each of the plurality of first-conductivity-type epitaxial layers when the each of the plurality of first-conductivity-type epitaxial layers is stacked; forming a first trench that reaches a predetermined depth from a surface of a first of each of the plurality of first-conductivity-type epitaxial layers, the first trench being formed after the first of the each of the plurality of first-conductivity-type epitaxial layers is formed by epitaxial growth but before the second-conductivity-type impurity is ion implanted; and diffusing the second-conductivity-type impurity region formed in the each of the plurality of first-conductivity-type epitaxial layers by performing heat treatment, and connecting to each other in a depth direction, the second-conductivity-type impurity region formed in the each of the plurality of first-conductivity-type epitaxial layers, and forming the second-conductivity-type region. When a second or a subsequent of the each of the plurality of first-conductivity-type epitaxial layers is formed by epitaxial growth, a new first trench is formed in a surface of an outermost surface layer that is outermost of the plurality of first-conductivity-type epitaxial layers, the new trench being formed from a recess formed corresponding to the first trench of a lower layer of the plurality of first-conductivity-type epitaxial layers, the lower layer being beneath the outermost surface layer. Ion implanting of the second-conductivity-type impurity performed for each stacking of the each of the plurality of first-conductivity-type epitaxial layers includes: forming on a surface of the each of the plurality of first-conductivity-type epitaxial layers, a first mask having an opening of a width that is wider than that of the first trench, the first mask exposing the first trench; and ion implanting the second-conductivity-type impurity using the first mask and forming the second-conductivity-type impurity region along an inner wall of the first trench.

In the embodiment, forming the first trench includes forming the first trench by dry etching.

In the embodiment, forming the first trench includes forming the first trench to have an open end having a width that is narrower than a width of a bottom of the first trench.

In the embodiment, in diffusing and connecting the second-conductivity-type impurity region formed in the each of the plurality of first-conductivity-type epitaxial layers and forming the second-conductivity-type region, the parallel pn layer is formed in which the second-conductivity-type region and the first-conductivity-type region are disposed to alternate repeatedly, the first-conductivity-type region being constituted by a portion of the plurality of first-conductivity-type epitaxial layers, the portion between formed second-conductivity-type regions.

In the embodiment, forming the first trench includes forming the first trench in a device region in which the parallel pn layer is formed and forming in a region surrounding a periphery of the device region, a second trench for an alignment mark.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
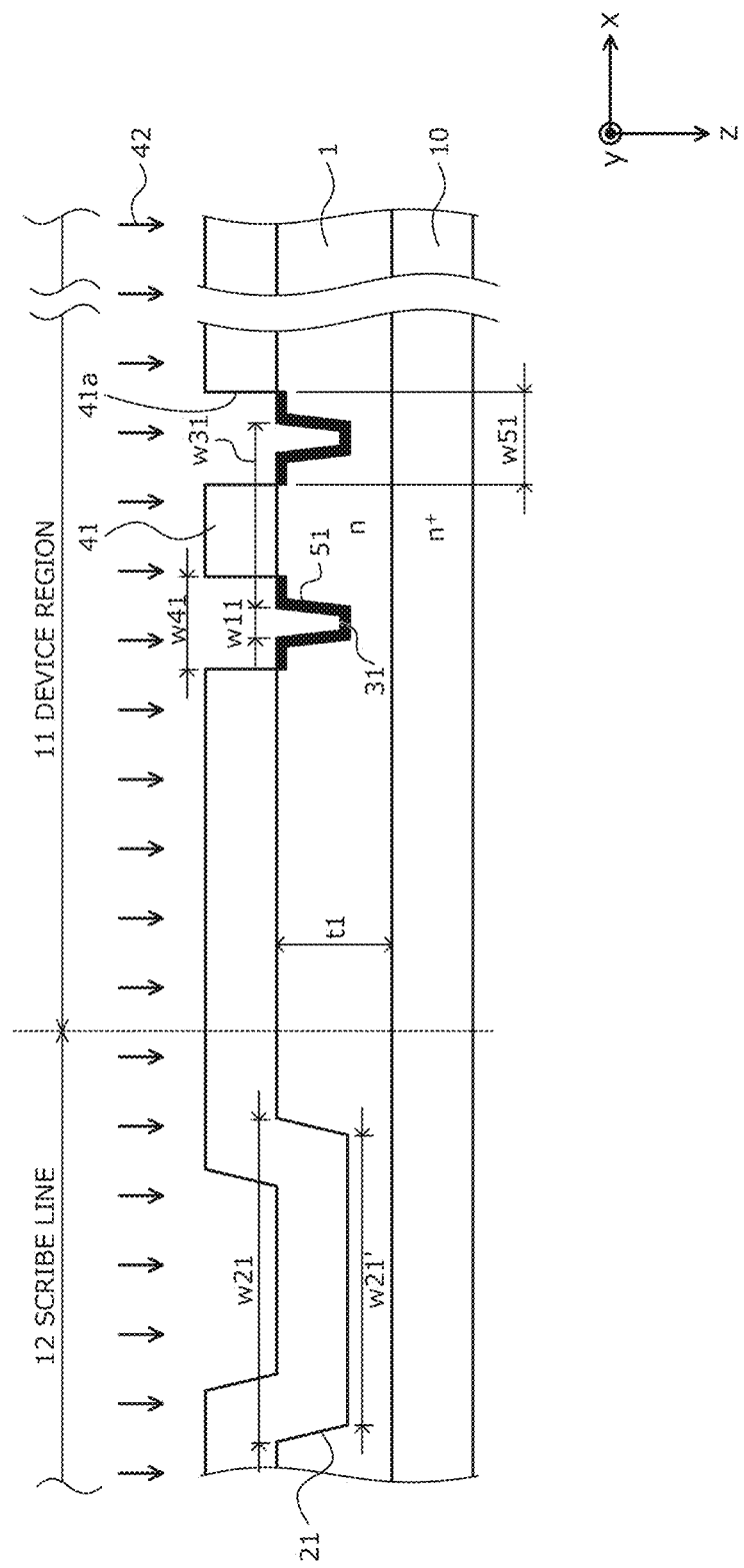
FIG. 1 is a cross-sectional view of a structure of a semiconductor device according to an embodiment during manufacture.

First, problems related to the conventional methods will be discussed. In the first conventional method by the multistage epitaxial method above, the p-type diffusion regions 141' to 143' have a diffusion width w101 along the lateral direction and a diffusion width d101 along the longitudinal direction that are substantially equal. Therefore, when the diffusion width w101 along the lateral direction of the p-type diffusion regions 141' to 143' is reduced to form the p-type regions 152 to have a high aspect ratio, a problem arises in that the p-type diffusion regions 141' to 143' constituting the p-type regions 152 of the parallel pn layer 150 are connected to each other along the longitudinal direction and locations occur where a width of the p-type regions 152 of the parallel pn layer 150 locally decreases.

In other words, in the first conventional method, the p-type regions 152 that extend vertically along the longitudinal direction cannot be formed spanning the n-type epitaxial layers that are stacked in multiple stages and may lead to degradation of the tradeoff relationship between breakdown voltage and ON resistance. Therefore, a problem arises in that to increase the amount by which the ends of the p-type diffusion regions 141' to 143' overlap each other along the longitudinal direction, the thickness of each of the n-type epitaxial layers 101 to 104 has to be reduced; however, the number of times (number of stages) that an n-type epitaxial layer has to be formed by epitaxial growth increases, whereby a problem of increased manufacturing cost arises.

Like the second conventional method by the multistage epitaxial method above, ion implantation of a p-type impurity with respect to a single n-type epitaxial layer is performed multiple times, whereby the p-type regions 182 of the parallel pn layer 180 may be extended vertically along the longitudinal direction to a greater extent than by the first conventional method. Accordingly, while the number of times that an n-type epitaxial layer is formed by epitaxial growth may be reduced, the number of the ion implantations 162, 164 of a p-type impurity performed for forming the p-type regions 182 increases, whereby a problem arises in that in the second conventional method as well, manufacturing cost increases.

In the third conventional method by the trench filling epitaxial method above, while p-type regions that have a high aspect ratio and extend vertically along the longitudinal direction may be formed, expensive equipment is necessary. Further, formation of trenches having a high aspect ratio and embedding an epitaxial layer in the trenches is difficult from a technical standpoint and processing time is necessary. For example, so that defects such as cavities in the epitaxial layers do not occur, it is necessary to spend time in embedding the epitaxial layer and a problem arises in that yield is poor.

Embodiments of a method of manufacturing a semiconductor device according to the present invention will be described in detail with reference to the accompanying drawings. In the present description and accompanying drawings, layers and regions prefixed with n or p mean that majority carriers are electrons or holes, respectively. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

Figure 7:
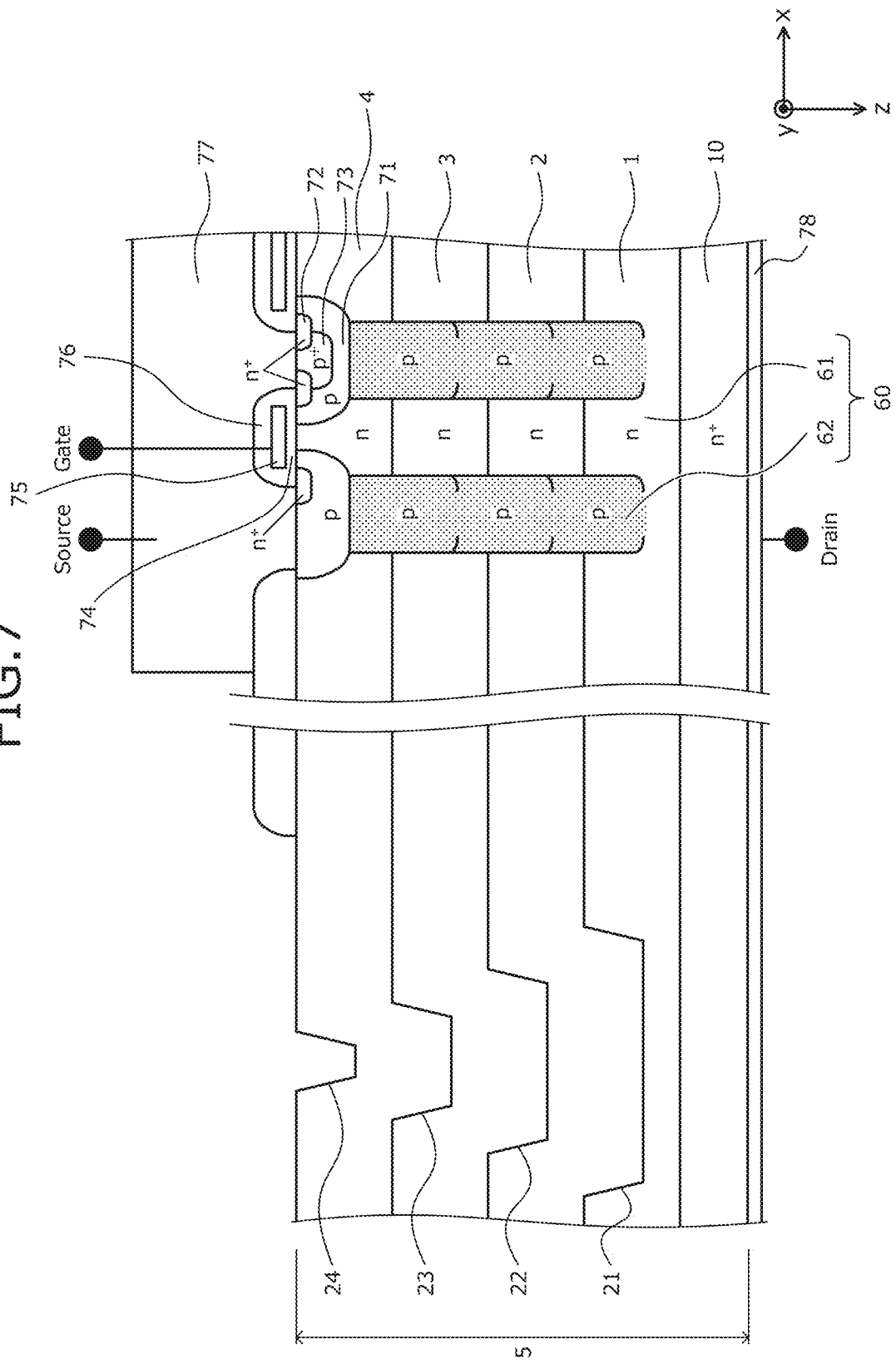
FIG. 7 is a cross-sectional view of a structure of the semiconductor device according to the embodiment during manufacture.
Figure 8:
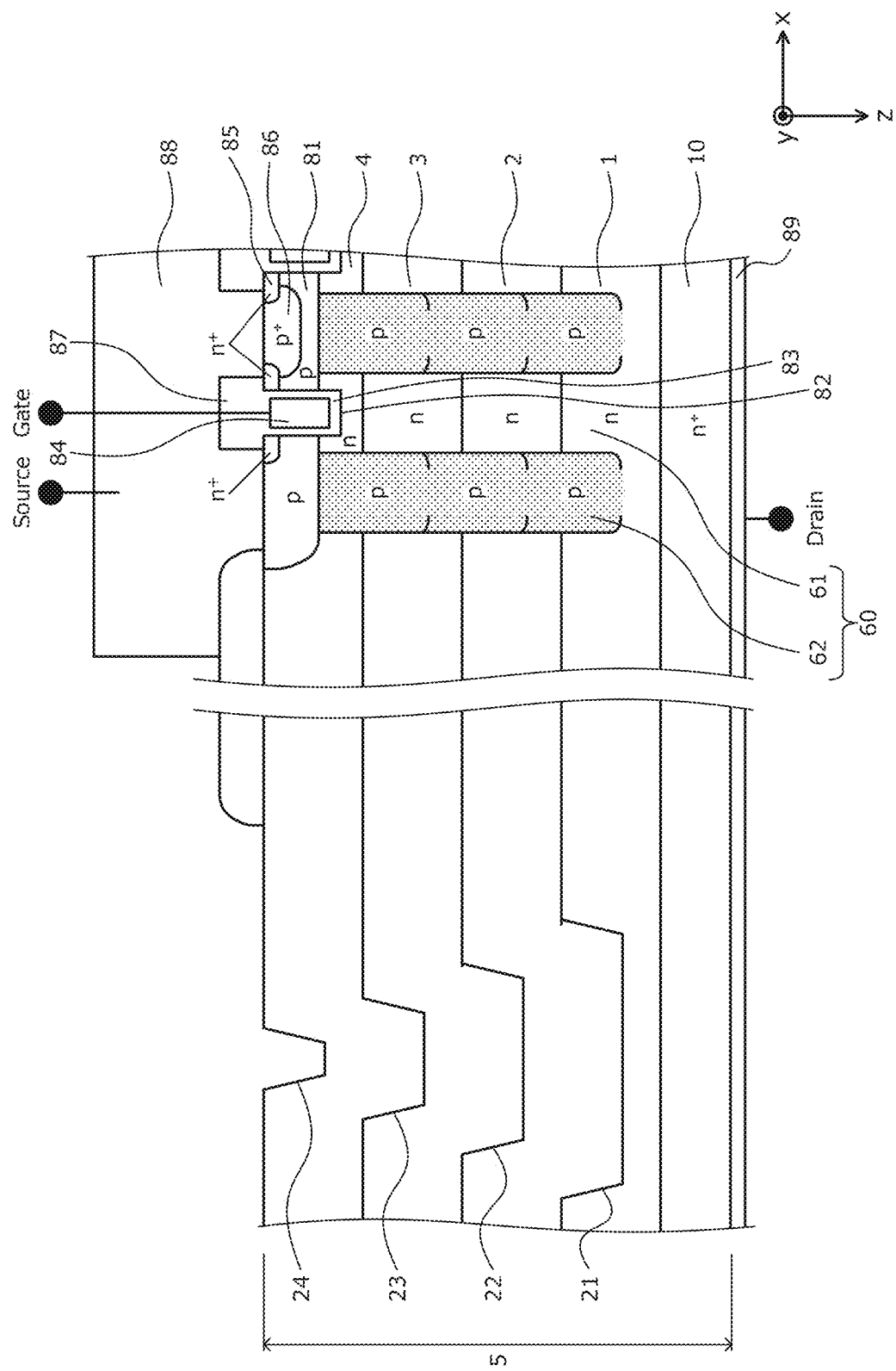
FIG. 8 is a cross-sectional view of another example of the structure of the semiconductor device according to the embodiment during manufacture.
Figure 9:
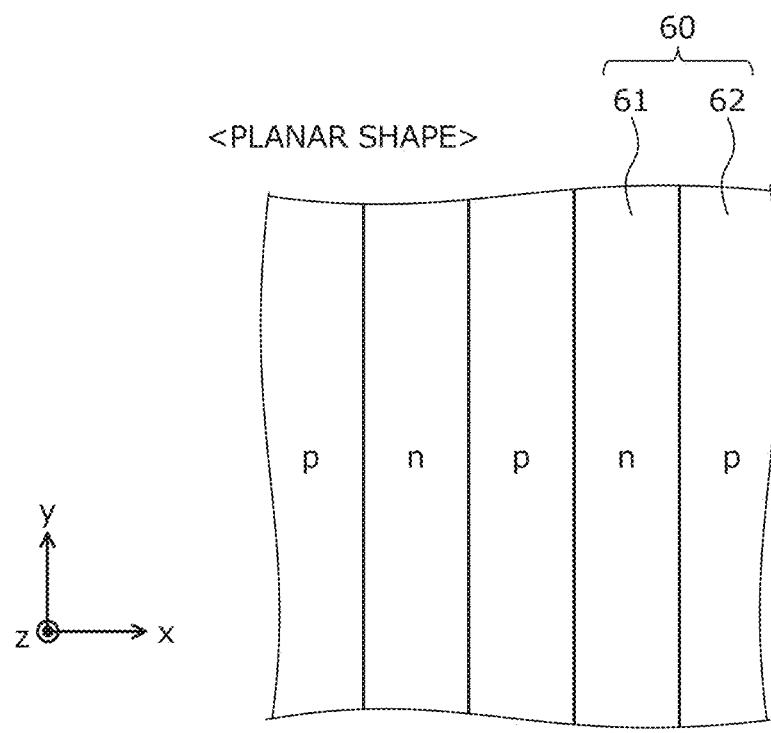
FIG. 9 is a plan view of an example of a layout when a parallel pn layer is viewed from a front surface of a semiconductor substrate in FIG. 6.
Figure 10:
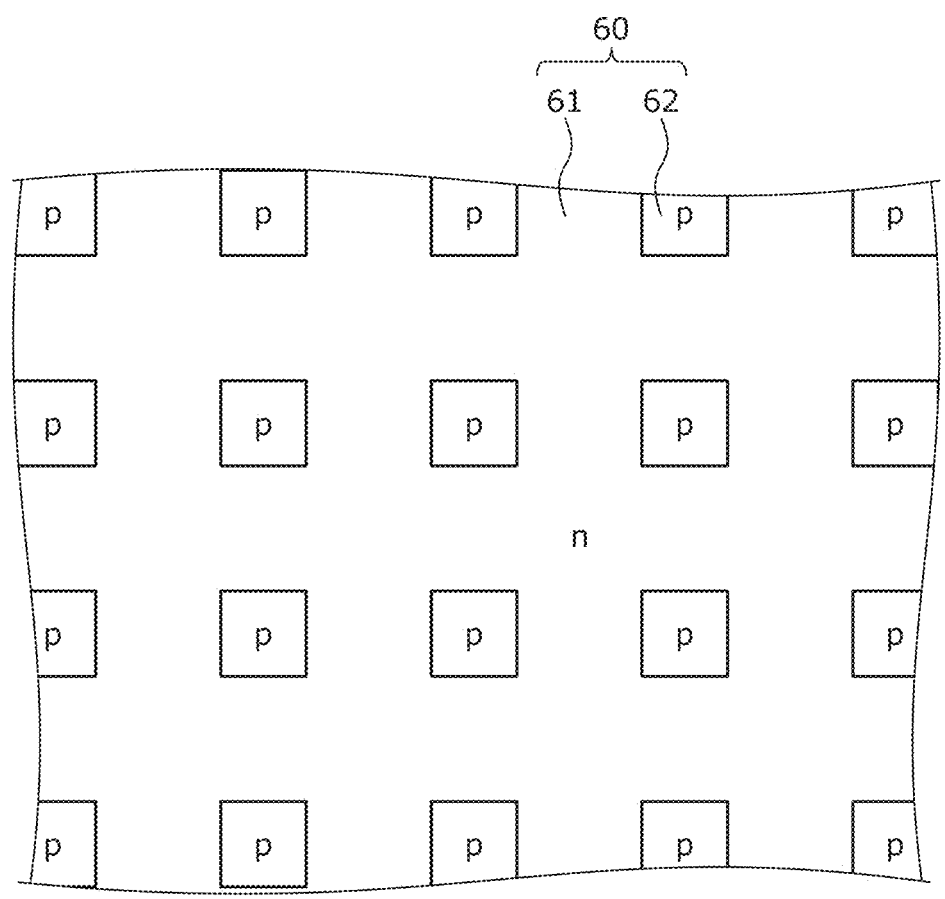
FIG. 10 is a plan view of an example of a layout when the parallel pn layer is viewed from the front surface of the semiconductor substrate in FIG. 6.
Figure 11:
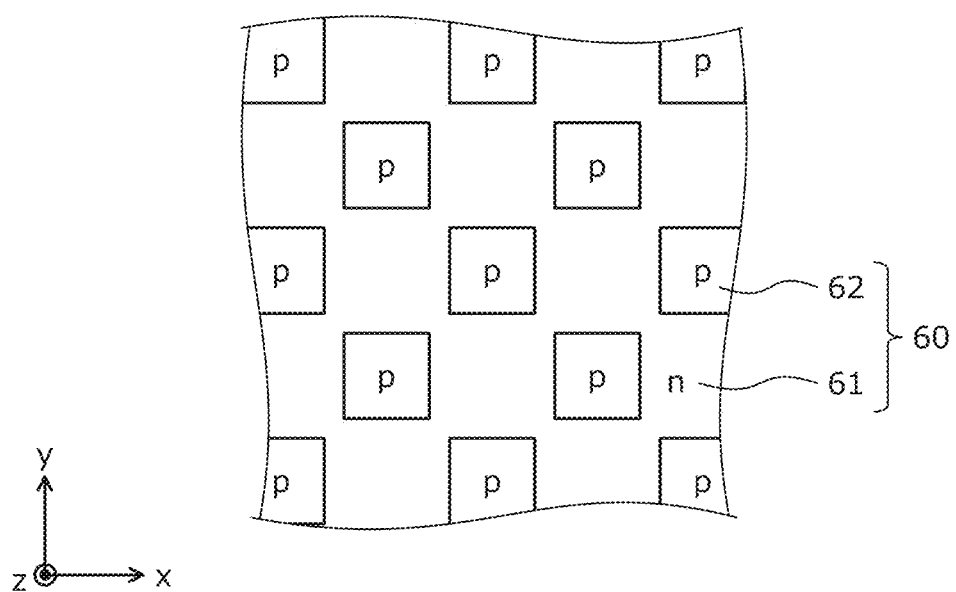
FIG. 11 is a plan view of an example of a layout when the parallel pn layer is viewed from the front surface of the semiconductor substrate in FIG. 6.

A method of manufacturing a semiconductor device according to an embodiment will be described taking as an example, a case in which semiconductor device having a breakdown voltage of 400V or higher (for example, 650V) is fabricated (manufactured). FIGS. 1, 3, 4, 5, 6 and 7 are cross-sectional views of a structure of the semiconductor device according to the embodiment during manufacture. FIG. 2 is an enlarged cross-sectional view near an impurity diffusion trench in FIG. 1. FIG. 8 is a cross-sectional view of another example of the structure of the semiconductor device according to the embodiment during manufacture. FIGS. 9, 10, and 11 are plan views of examples of layouts when a parallel pn layer is viewed from a front surface of a semiconductor substrate in FIG. 6.

The method of manufacturing the semiconductor device according to the embodiment is a method of manufacturing a super junction (SJ) semiconductor device that has, as a drift layer, a parallel pn layer 60 in which an n-type region 61 with an increased impurity concentration and a p-type region 62 are disposed to repeatedly alternate along a direction (the lateral direction) that is parallel to a front surface of a semiconductor substrate 5. Herein, a case in which a metal oxide semiconductor field effect transistor (MOSFET) is fabricated will be described as an example.

Figure 2:
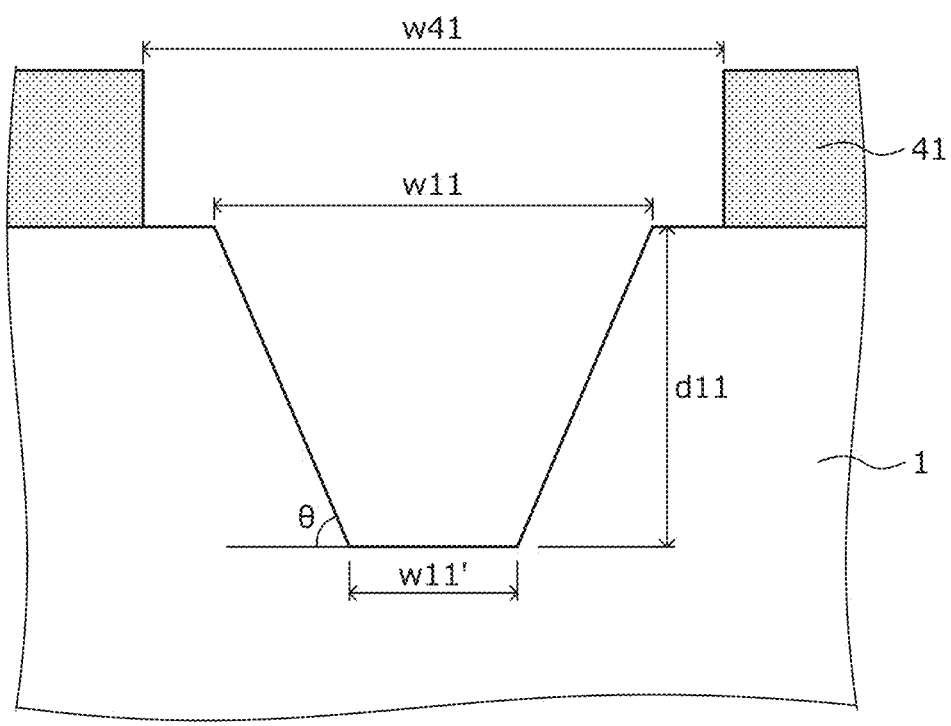
FIG. 2 is an enlarged cross-sectional view near an impurity diffusion trench in FIG. 1.

First, as depicted in FIG. 1, an n-type epitaxial layer (a first first-conductivity-type epitaxial layer) 1 is formed by epitaxial growth on an n$^+$-type starting substrate (semiconductor wafer) 10. A thickness t1 of the n-type epitaxial layer 1, for example, is determined with consideration of a depth d11 of an impurity diffusion trench (first trench, second trench) 31 that is formed by a subsequent process, and with consideration of a deepest position toward the n$^+$-type starting substrate 10 when a p-type impurity region 51 that is formed by a subsequent process is extended along a depth direction z (longitudinal direction) by a thermal diffusion process thereafter. In particular, the thickness t1 of the n-type epitaxial layer 1, for example, may be in a range from 3 μm to 7 μm. An n-type impurity concentration of the n-type epitaxial layer 1, for example, is in a range from about $3 \times 10^{15}/cm^3$ to $1 \times 10^{16}/cm^3$.

The n$^+$-type starting substrate 10 constitutes a rear surface of the semiconductor substrate (semiconductor wafer) 5 described hereinafter and in which n-type epitaxial layers 1 to 4 (refer to FIGS. 3 to 6) are stacked until a predetermined product thickness is achieved. In the semiconductor substrate 5, a device region 11 is provided in a matrix-like layout as viewed from the front surface of the semiconductor substrate 5, and a scribe line 12 is provided that in a grid-like layout, surrounds a periphery of the device region 11. The device region 11 is a region that becomes a semiconductor chip when the semiconductor substrate 5 is cut into individual chips. In the device region 11, through the following processes, the n-type regions 61 and the p-type regions 62 of the parallel pn layer 60 are formed.

Next, in a portion of the n-type epitaxial layer 1, the portion that corresponds to the scribe line 12, a trench (hereinafter, alignment mark trench) 21 for an alignment mark and reaching a predetermined depth from a surface of the n-type epitaxial layer 1 is formed. Concurrently with the formation of the alignment mark trench 21, the impurity diffusion trench 31 is formed in portions that correspond to formation regions of the p-type region 62 (refer to FIG. 6) of the parallel pn layer 60. Provision of the impurity diffusion trench 31 facilitates diffusion of a p-type impurity along the longitudinal direction (the depth direction of the impurity diffusion trench 31), the p-type impurity being introduced into the n-type epitaxial layers 1 to 3 by ion implantation that is performed with formation of each of the n-type epitaxial layers 1 to 3 by epitaxial growth by a subsequent process.

The alignment mark trench 21 and the impurity diffusion trench 31 are formed by dry etching using a non-depicted resist mask having opened portions that respectively correspond to formation regions of the alignment mark trench 21 and the impurity diffusion trench 31. An opening width of openings of the resist mask, for example, is about equal to a width w11' of a bottom (lower portion) of the impurity diffusion trench 31. The impurity diffusion trench 31, by side etching, has a tapered cross-sectional shape in which a width w11 of an open end (upper portion) is wider than the width w11' of the bottom (lower portion) (refer to FIG. 2).

An angle θ formed by a side wall of the impurity diffusion trench 31 and an extended line of the bottom of the impurity diffusion trench 31, for example, may be in a range from about 85° to 90°, inside silicon. The depth d11 of the impurity diffusion trench 31 may be ¼ times the thickness t1 of the n-type epitaxial layer 1 or greater; for example, when the thickness t1 of the n-type epitaxial layer 1 is about 4 μm, the depth d11 may be in a range from about 1 μm to 2 μm. The depth d11 of the impurity diffusion trench 31 may be substantially equal to the thickness t1 of the n-type epitaxial layer 1. In other words, the depth d11 of the impurity diffusion trench 31 suffices to be one times the thickness t1 of the n-type epitaxial layer 1 or less.

In the impurity diffusion trench 31, the narrower is the width w11 of the open end and the deeper is the depth d11, the more advantageous. A reason for this is that the narrower is the width w11 of the open end of the impurity diffusion trench 31 and the deeper is the depth d11 of the impurity diffusion trench 31, an aspect ratio (=thickness d10/width w10) of diffusion of the p-type impurity region 51 may be increased to 2 or higher in the p-type regions 62 of the parallel pn layer 60. A pitch w31 of the impurity diffusion trench 31 is substantially equal to a repeat pitch w3 of the p-type region 62 of the parallel pn layer 60 and is set according to the breakdown voltage.

A width w21 of an open end and a width w21' of a bottom of the alignment mark trench 21, similarly to the impurity diffusion trench 31, are such that the alignment mark trench 21 has a tapered cross-sectional shape. The width w21 of the open end and the width w21' of the bottom of the alignment mark trench 21, for example, are wider than the width w11 of the open end and the width w11' of the bottom of the impurity diffusion trench 31, respectively. An angle formed by a side wall of the alignment mark trench 21 and an extended line of the bottom of the impurity diffusion trench 31, for example, is substantially equal to the angle θ formed by the side wall of the impurity diffusion trench 31 and the extended line of the bottom of the impurity diffusion trench 31.

Next, the resist mask used in forming the alignment mark trench 21 and the impurity diffusion trenches 31 is removed. Next, by photolithography and etching, a resist mask 41 having opened portions that correspond to formation regions of the p-type region 62 of the parallel pn layer 60 is formed on the surface of the n-type epitaxial layer 1. An opening width w41 of openings 41a of the resist mask 41 (refer to FIG. 2) is substantially equal to the width w10 of the p-type regions 62 of the parallel pn layer 60. Further, the opening width w41 of the openings 41a of the resist mask 41 is wider than the width w11 of the open end of the impurity diffusion trenches 31.

The opening width w41 of the openings 41a of the resist mask 41, for example, may be in a range from about 1 μm to 2 μm. The width w11 of the open end of the impurity diffusion trenches 31 is set to be about 0.8 times the opening width w41 of the openings 41a of the resist mask 41 or less. Next, an ion implantation 42 of a p-type impurity such as, for example, boron (B) is performed using the resist mask 41 as a mask, whereby from a surface layer of the n-type epitaxial layer 1 exposed by the openings 41a of the resist mask 41, the p-type impurity region 51 is selectively formed in the surface layer of portions of the n-type epitaxial layer 1, the portions that are exposed at an inner wall of the impurity diffusion trenches 31. In other words, the p-type impurity region 51 has a cross-sectional shape that follows the inner wall of the impurity diffusion trench 31. This cross-sectional shape is substantially a U-shape or substantially a V-shape having a portion along the width w11' of the bottom of the impurity diffusion trench 31 and flat portions that are along the surface of the n-type epitaxial layer 1 and formed by a difference in the magnitude of width between both ends, i.e., the width w11 of the open end of the impurity diffusion trenches 31 and the opening width w41 of the openings 41a of the resist mask 41.

A longest portion of the p-type impurity region 51 in the lateral direction, as viewed from the front surface of the semiconductor substrate 5, has a length w51 that is substantially equal to the opening width w41 of the openings 41a of the resist mask 41. A width w51 of the p-type impurity region 51 is a distance between ends of the p-type impurity region 51, as viewed from the front surface of the semiconductor substrate 5 described hereinafter. The ends of the p-type impurity region 51 are portions of the p-type impurity region 51, the portions that extend from a surface layer of the inner wall of the impurity diffusion trench 31 to the surface layer of the n-type epitaxial layer 1. A dose amount of the ion implantation 42 of the p-type impurity, for example, is in a range from about $0.6 \times 10^{13}/cm^2$ to $1.5 \times 10^{13}/cm^2$ and, for example, may be $1 \times 10^{13}/cm^2$.

Figure 3:
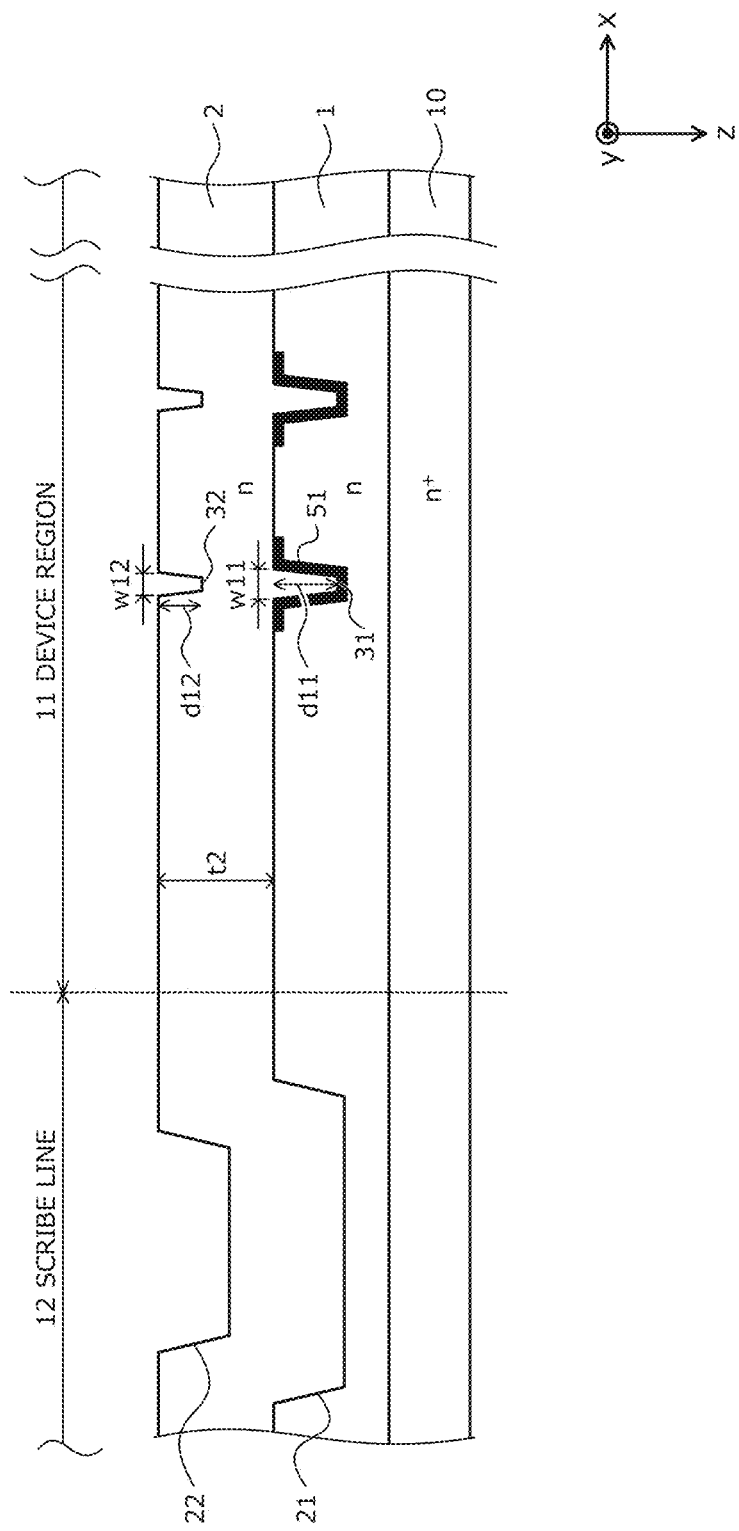
FIG. 3 is a cross-sectional view of a structure of the semiconductor device according to the embodiment during manufacture.

Next, as depicted in FIG. 3, the resist mask 41 used in forming the p-type impurity region 51 is removed and a n-type epitaxial layer (second first-conductivity-type epitaxial layer) 2 is formed by epitaxial growth on the n-type epitaxial layer 1. An n-type impurity concentration of the n-type epitaxial layer 2, for example, is about equal to an n-type impurity concentration of the n-type epitaxial layer 1 that is underlying. The n-type epitaxial layer 2 is further formed by epitaxial growth in the impurity diffusion trench 31 that is formed in the n-type epitaxial layer 1 that is underlying. Here, the impurity diffusion trenches 31 that are formed in the n-type epitaxial layer 1 that is underlying are not completely filled, whereby resulting recesses remain at the surface of the n-type epitaxial layer 2 and from the recesses, new impurity diffusion trenches 32 are formed.

In other words, a thickness t2 of the n-type epitaxial layer 2 is regarded as a thickness formed by the impurity diffusion trenches 32 corresponding to the recesses in the surface of the n-type epitaxial layer 2 due to the impurity diffusion trenches 31 that are formed in the n-type epitaxial layer 1 that is underlying. The n-type epitaxial layer 2 is formed by epitaxial growth, along the inner walls of the impurity diffusion trenches 31 that are formed in the n-type epitaxial layer 1 that is underlying. Therefore, a width w12 of an open end and a width of a bottom of the impurity diffusion trenches 32 are respectively narrower than the width w11 of the open end and the width w11' of the bottom of the impurity diffusion trenches 31 that are formed in the n-type epitaxial layer 1 that is underlying. Additionally, a depth d12 of the impurity diffusion trenches 32 is shallower than the depth d11 of the impurity diffusion trenches 31 that are formed in the n-type epitaxial layer 1 that is underlying.

Figure 4:
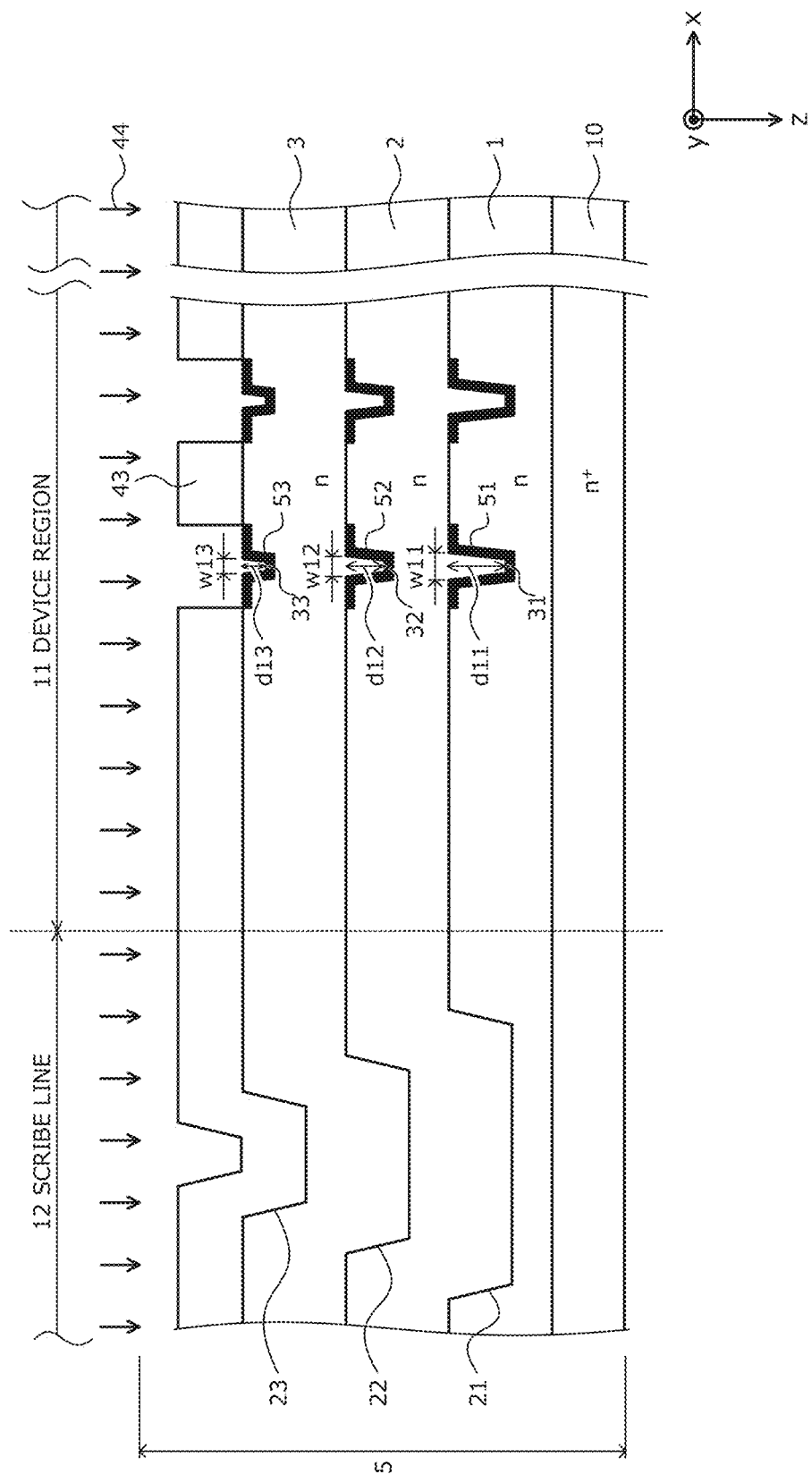
FIG. 4 is a cross-sectional view of a structure of the semiconductor device according to the embodiment during manufacture.

Next, as depicted in FIG. 4, a process including formation of a resist mask, ion implantation of a p-type impurity, and epitaxial growth of an n-type epitaxial layer is repeatedly performed. As a result, the n-type epitaxial layers 2, 3 are formed in which p-type impurity regions 52, 53 are formed in portions that correspond to formation regions of the p-type region 62 of the parallel pn layer 60. The p-type impurity region 52, similarly to the p-type impurity region 51 that is formed in the n-type epitaxial layer 1, is formed spanning a surface layer of an inner wall of the impurity diffusion trenches 32 of the surface of the n-type epitaxial layer 2, from a surface layer of the n-type epitaxial layer 2 exposed by openings in a resist mask.

Figure 5:
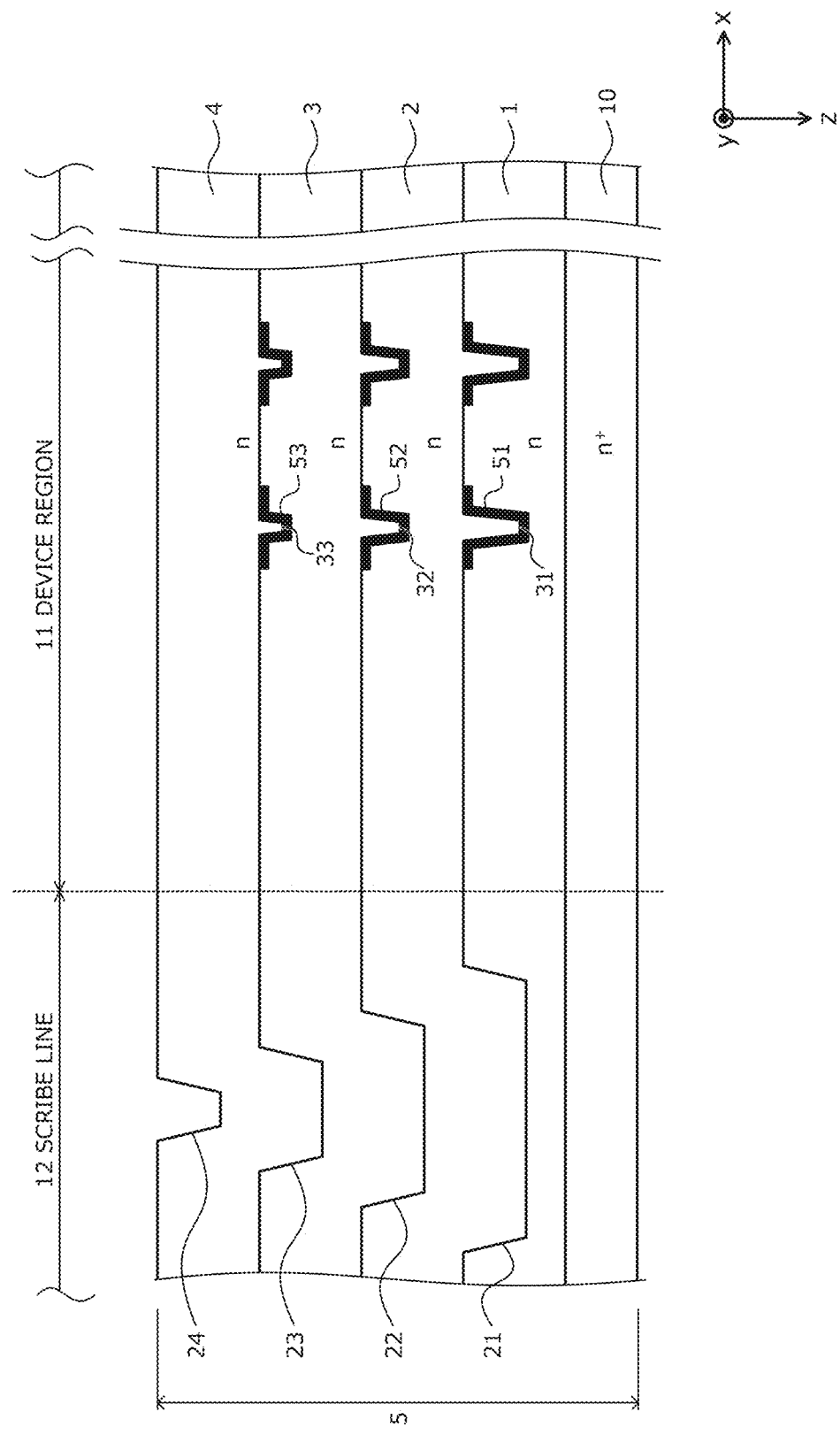
FIG. 5 is a cross-sectional view of a structure of the semiconductor device according to the embodiment during manufacture.

The impurity diffusion trenches 32 that are formed in the n-type epitaxial layer 2 that is underlying are not completely filled, whereby resulting recesses remain at the surface of the n-type epitaxial layer 3 and from the recesses, new impurity diffusion trenches 33 are formed. The p-type impurity region 53, similarly to the p-type impurity region 51 that is formed the n-type epitaxial layer 1, is formed spanning a surface layer of an inner wall of the impurity diffusion trenches 33 of the surface of the n-type epitaxial layer 3, from a surface layer of the n-type epitaxial layer 3 exposed by openings in a resist mask 43. Additionally, as depicted in FIG. 5, the n-type epitaxial layer 4 in which no p-type impurity region is formed is stacked as the outermost surface layer.

Instead of the n-type epitaxial layer 4, a non-doped epitaxial layer may be stacked on the surface of the n-type epitaxial layer 3. Impurity diffusion trenches may be formed in the surface of the n-type epitaxial layer 4 from recesses corresponding to the impurity diffusion trenches 33 of the n-type epitaxial layer 3 that is underlying and, similarly to the n-type epitaxial layers 1 to 3 that are the layers beneath, p-type impurity regions may be formed along inner walls of the impurity diffusion trenches. In FIG. 4, the p-type impurity region 53 is selectively formed along the inner walls of the impurity diffusion trenches 33 of the surface of the n-type epitaxial layer 3 by an ion implantation 44 of a p-type impurity using, as a mask, the resist mask 43 that has opened portions that correspond to formation regions of the p-type region 62 of the parallel pn layer 60.

In other words, in the present invention, ion implantation of a p-type impurity is performed once for each epitaxial growth of the n-type epitaxial layers 1 to 3. By these ion implantations of a p-type impurity, the p-type impurity regions 51 to 53 that constitute the p-type regions 62 of the parallel pn layer 60 are respectively formed along the inner walls of the impurity diffusion trenches 31 to 33 of the n-type epitaxial layer 1 to 3. In the ion implantations for forming the p-type impurity regions 51 to 53, resist masks are used that have in portions thereof, openings that have a same opening width, the portions being at positions that are the same in each of the resist masks, along the lateral direction of the semiconductor substrate 5.

A width of w13 an open end and a width of a bottom of the impurity diffusion trenches 33 of the surface of the n-type epitaxial layer 3 are narrower than the width w12 of the open end and the width of the bottom of the impurity diffusion trenches 32 that are formed in the surface of the n-type epitaxial layer 2 that underlies the n-type epitaxial layer 3. Additionally, a depth d13 of the impurity diffusion trenches 33 is shallower than the depth d12 of the impurity diffusion trenches 32 of the surface of the n-type epitaxial layer 2 that underlies the n-type epitaxial layer 3. In other words, the widths of the open ends and the widths of the bottoms of the impurity diffusion trenches are narrower the more superficial is the n-type epitaxial layer of the impurity diffusion trenches in the surface thereof. The depths of impurity diffusion trenches are shallower the more superficial is the n-type epitaxial layer in which the impurity diffusion trenches are formed in the surface thereof.

In this manner, in the impurity diffusion trenches 31 to 33, the widths w11 to w13 of the open ends, the widths of the bottoms, and the depths d11 to d13 respectively differ. Therefore, surface areas of the p-type impurity regions 51 to 53 that are formed along the inner walls of the impurity diffusion trenches 31 to 33 also differ. In particular, of the p-type impurity regions 51 to 53, the surface area of the p-type impurity region 51 formed along the inner walls of the impurity diffusion trenches 31 of the n-type epitaxial layer 1 that is the lowermost layer is the largest. The surface areas of the p-type impurity regions 52, 53 that are formed along the inner walls of the impurity diffusion trenches 32, 33 of the surfaces of the n-type epitaxial layers 2, 3 that are upper layers are smaller the more superficial is the n-type epitaxial layer 2, 3 in which the p-type impurity region 52, 53 is positioned.

Therefore, when the dose amount of the ion implantations for forming the p-type impurity regions 51 to 53 is constant, the impurity concentration is highest in the p-type impurity region 51 for which the surface area is the largest. The dose amount of the ion implantations for forming the p-type impurity regions 51 to 53 may be constant in this manner, or may differ as described hereinafter. For example, the dose amount of the ion implantations for forming the p-type impurity regions 52, 53 may be set higher the more superficial is the n-type epitaxial layers 2, 3 in which the p-type impurity regions 52, 53 are formed, and the p-type impurity regions 51 to 53 may be set to have n-type impurity concentrations that are substantially equal. By setting the p-type impurity regions 51 to 53 to have substantially equal n-type impurity concentrations, the impurity concentration of the p-type regions 62 of the parallel pn layer 60 may be made uniform along the longitudinal direction. Uniform impurity concentration means substantially the same impurity concentration in a range that includes error allowed by process variation.

In FIG. 5, a state is depicted in which the resist mask 43 used in forming the p-type impurity region 53 in the impurity diffusion trenches 33 of the surface of the n-type epitaxial layer 3 is removed, and the n-type epitaxial layer 4 is formed by epitaxial growth on the n-type epitaxial layer 3. By the processes up to here, the semiconductor substrate 5 is fabricated in which the n-type epitaxial layers 1 to 4 are sequentially stacked on the $n^+$-type starting substrate 10. An exposed surface (rear surface of the $n^+$-type starting substrate 10) of the $n^+$-type starting substrate 10 constitutes a rear surface of the semiconductor substrate 5. An exposed surface of the n-type epitaxial layer 4 constitutes the front surface of the semiconductor substrate 5. At the exposed surface of the n-type epitaxial layer 4, impurity diffusion trenches may be formed that correspond to recesses due to the impurity diffusion trenches 33 of the n-type epitaxial layer 3 that is underlying, or as depicted in FIG. 5, the impurity diffusion trenches 33 may be completely filled.

The width of the open end and the width of the bottom of the impurity diffusion trenches (in FIG. 5, the impurity diffusion trenches 33 of the surface of the n-type epitaxial layer 3) of the surface of the n-type epitaxial layer that underlies the n-type epitaxial layer 4 that is the most superficial layer are narrower the more n-type epitaxial layers are stacked on the n-type epitaxial layer 1 that is the lowermost layer. Additionally, the depth of the impurity diffusion trenches of the surface of the n-type epitaxial layer that underlies the n-type epitaxial layer 4 that is the most superficial layer is shallower the more n-type epitaxial layers are stacked on the n-type epitaxial layer 1 that is the lowermost layer. Therefore, the impurity diffusion trenches 33 of the surface of the n-type epitaxial layer 3 that is underlying are easily filled completely by the n-type epitaxial layer 4 that is the most superficial layer.

Further, when n-type epitaxial layers (i.e., the n-type epitaxial layers 2, 3 that are intermediate layers) in which impurity diffusion trenches have to be formed at the surfaces thereof are formed by epitaxial growth, instances may occur where the impurity diffusion trenches 32, 33 are not formed in the surfaces, or the depths d12, d13 of the impurity diffusion trenches 32, 33 are too shallow. In such instances, in the n-type epitaxial layers 2, 3, the impurity diffusion trenches 32, 33 may be formed at positions that oppose, in the depth direction, the impurity diffusion trenches 31, 32 of the underlying n-type epitaxial layers 1, 2, or the depths d12, d13 of the impurity diffusion trenches 32, 33 may be increased.

Further, with stacking of each of the n-type epitaxial layers 2 to 4, in the respective surfaces of the n-type epitaxial layers 2 to 4, new alignment mark trenches 22 to 24 are formed in which a width of an open end and a width of a bottom are narrower than those of the alignment mark trenches 21 to 23 of the n-type epitaxial layer 1 to 3 that is underlying. Further, in the n-type epitaxial layer 1 that is the lowermost layer, as described above, the alignment mark trench 21 is formed in which the width w21 of the open end and the width w21' of the bottom are wider than those of the impurity diffusion trench 31. Therefore, even when the impurity diffusion trenches are for the most part not formed in the n-type epitaxial layer 4 that is the most superficial layer, a recess corresponding to the alignment mark trench 23 of the n-type epitaxial layer 3 that is underlying remains at the surface of the n-type epitaxial layer 4 and therefore, the alignment mark trench 24 that is formed from the recess may be formed.

Figure 6:
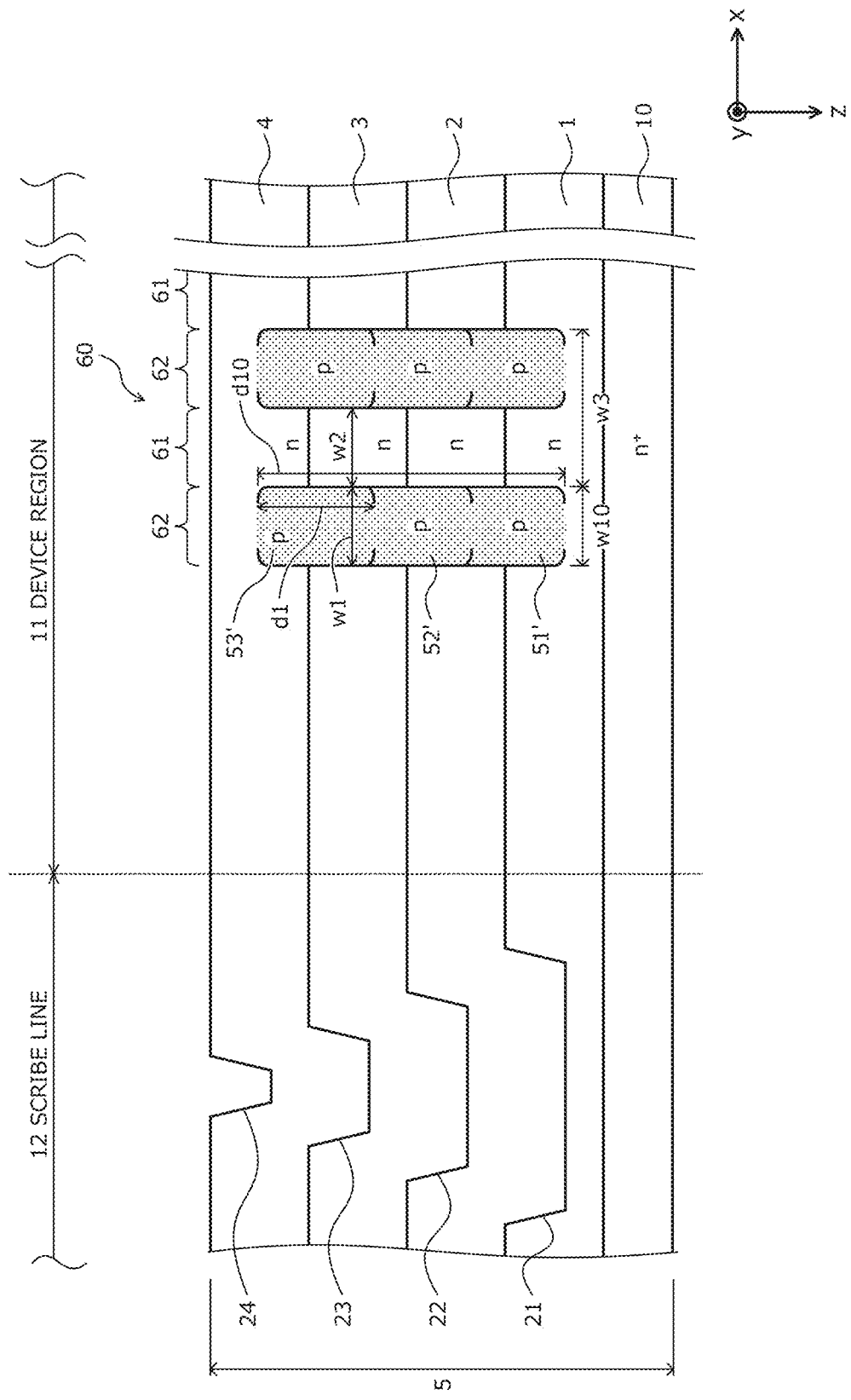
FIG. 6 is a cross-sectional view of a structure of the semiconductor device according to the embodiment during manufacture.

Next, as depicted in FIG. 6, the p-type impurity that is ion implanted into the n-type epitaxial layers 1 to 3 is diffused by heat treatment (hereinafter, thermal diffusion process). In the thermal diffusion process, the p-type impurity in the n-type epitaxial layers 1 to 3 easily diffuses into portions having low p-type impurity concentrations and therefore, diffuses along the longitudinal direction before the lateral direction. In particular, the p-type impurity in the n-type epitaxial layers 1 to 3 diffuse into portions of the n-type epitaxial layers 2 to 4, the portions that are embedded in the impurity diffusion trenches 31 to 33, and into portions of the n-type epitaxial layers 2, 3, the portions that are between the bottoms of adjacent impurity diffusion trenches 31 to 33. Therefore, the p-type impurity regions 51 to 53 each easily extends along the longitudinal direction, thereby forming the p-type diffusion regions (first second-conductivity-type impurity regions) 51', the p-type diffusion regions (second first second-conductivity-type impurity regions) 52', and the p-type diffusion regions 53' having a width w1 that is substantially equal to a width (a length along a first direction x indicated by reference characters w51 in FIG. 1) of the p-type impurity regions 51 to 53.

Further, the p-type impurity regions 51 to 53 each easily extends along the longitudinal direction, whereby a diffusion depth (length along the longitudinal direction) dl of the p-type diffusion regions 51' to 53' formed by the p-type impurity regions 51 to 53 extending, is more than one times a width w1 of the p-type diffusion regions 51' to 53', respectively. As a result, by a state where ends of adjacent p-type diffusion regions 51' to 53' in the depth direction assuredly overlap along the longitudinal direction, the ends of the adjacent p-type diffusion regions 51' to 53' are assuredly connected. As a result, spanning the n-type epitaxial layers 1 to 4 that are stacked in multiple stages, the p-type diffusion regions 51' to 53' are connected, forming the p-type regions 62 that extend vertically along the longitudinal direction. The parallel pn layer 60 is constituted by the p-type regions 62 and the n-type regions 61 that are portions of the n-type epitaxial layers 1 to 4, the portions that are between adjacent p-type regions 62.

The p-type impurity regions 51 to 53 each easily extends along the longitudinal direction, whereby the width w10 of the p-type regions 62 of the parallel pn layer 60 is substantially equal to the width w1 of the p-type diffusion regions 51' to 53'. Additionally, a width w2 of portions of the n-type epitaxial layers 1 to 4, the portions that are between adjacent p-type regions 62, i.e., a width of the n-type regions 61 of the parallel pn layer 60 may remain substantially the same width as before the thermal diffusion process. The width of the n-type regions 61 of the parallel pn layer 60, for example, is equal to the width w10 of the p-type regions 62 of the parallel pn layer 60 and, for example, may be in a range from about 2 μm to 4 μm. The repeat pitch w3 of the p-type region 62 of the parallel pn layer 60, for example, may be in a range from about 4 μm to 8 μm.

Figure 23:
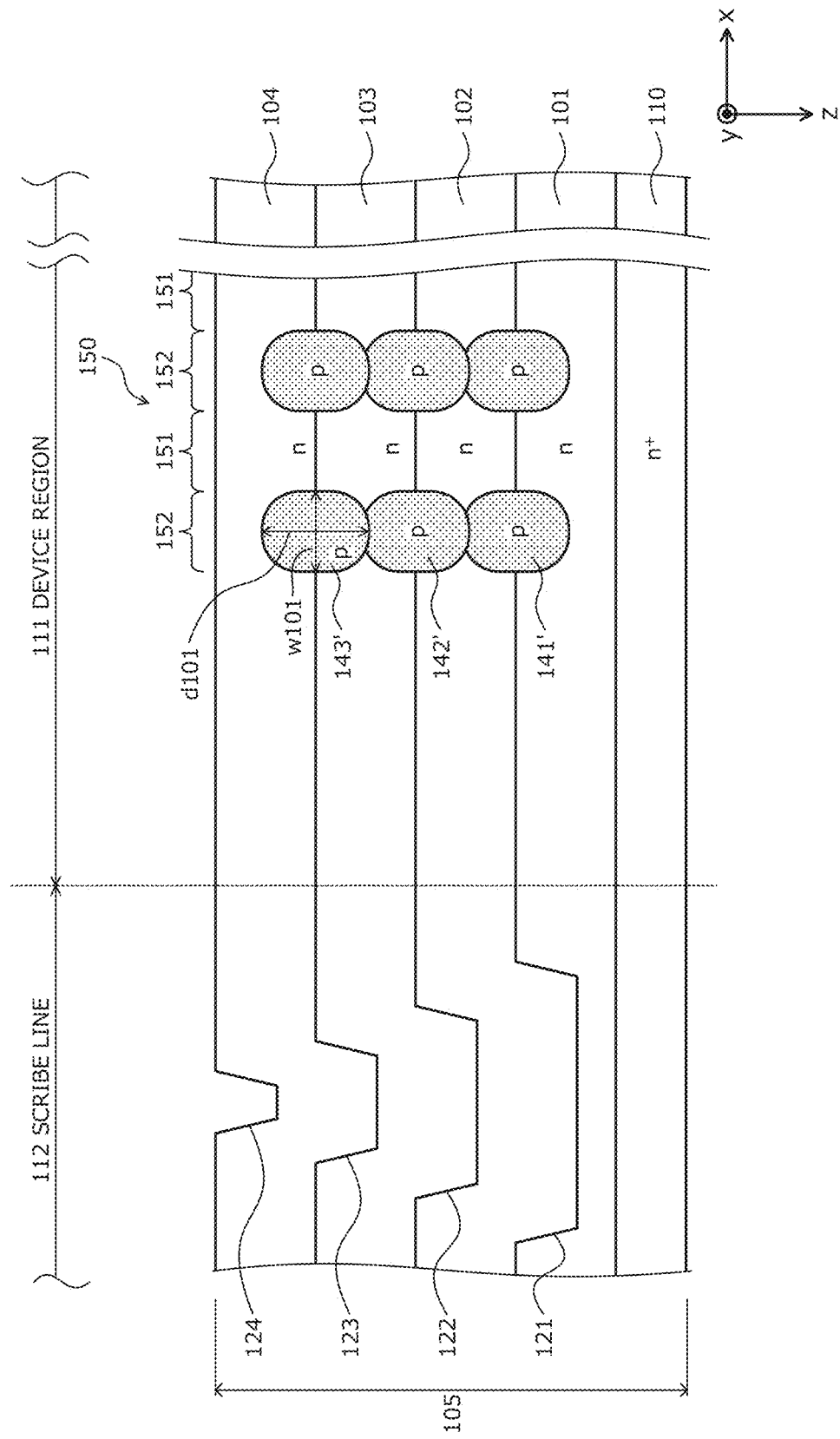
FIG. 23 is a cross-sectional view of the parallel pn layer during formation by the first conventional method.
Figure 24:
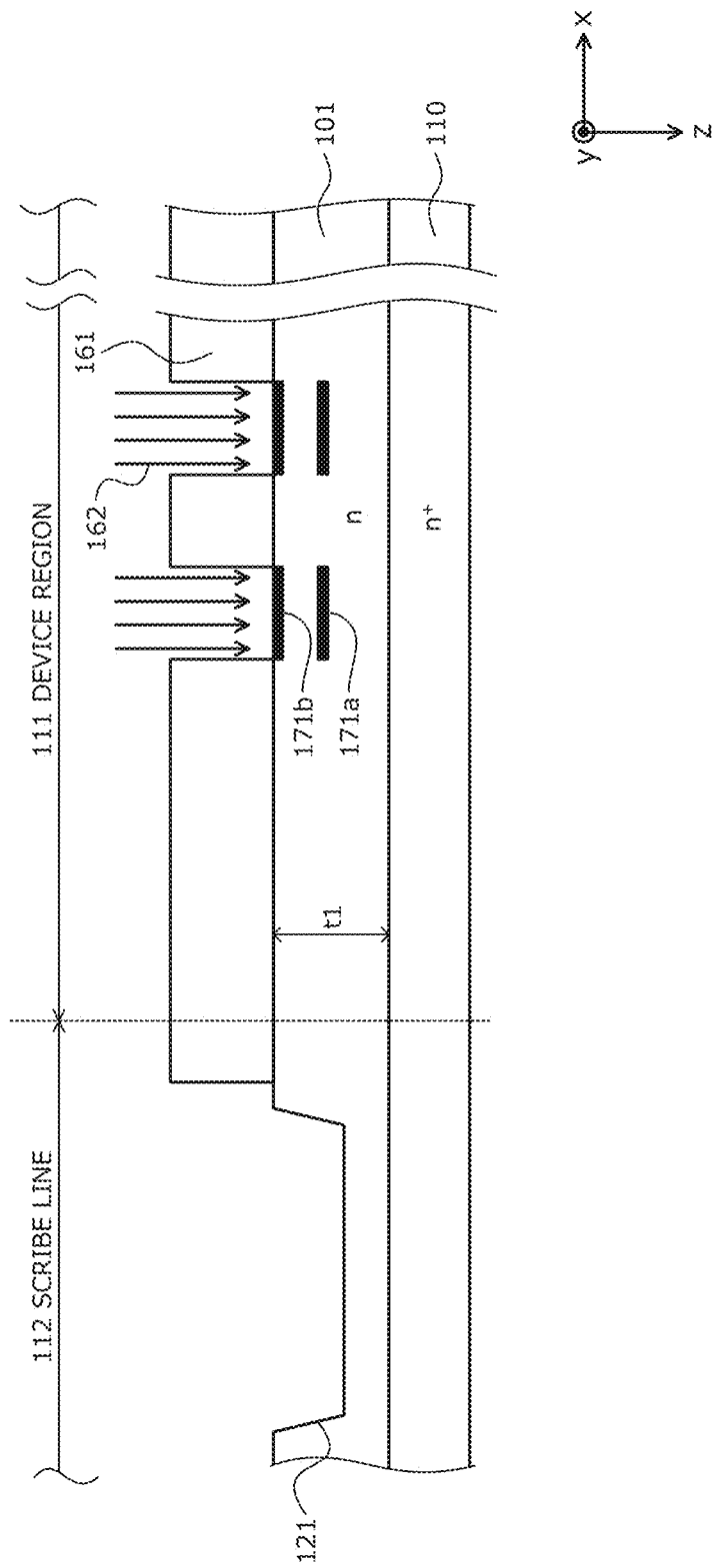
FIG. 24 is a cross-sectional view of the parallel pn layer during formation by the second conventional method.
Figure 25:
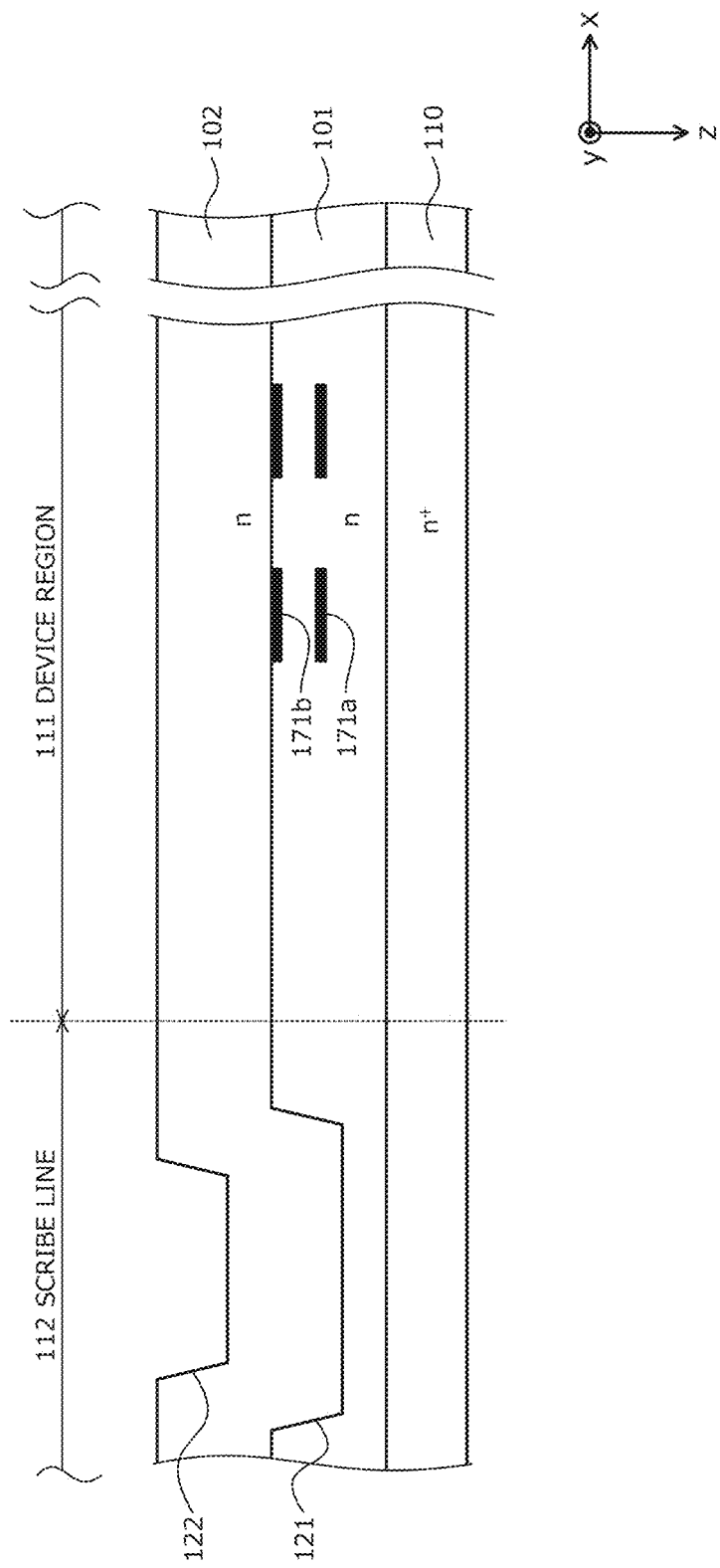
FIG. 25 is a cross-sectional view of the parallel pn layer during formation by the second conventional method.
Figure 26:
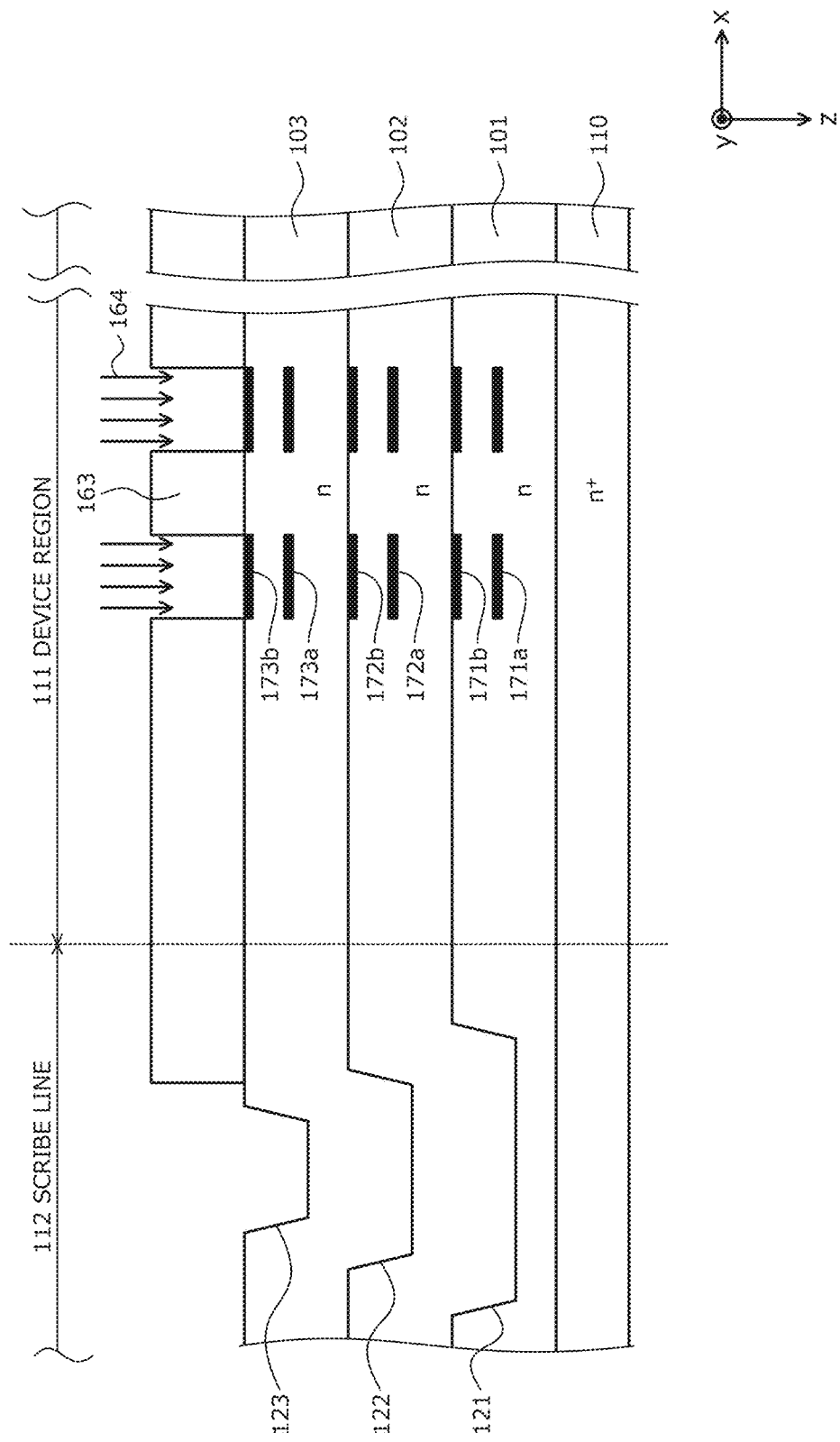
FIG. 26 is a cross-sectional view of the parallel pn layer during formation by the second conventional method.
Figure 27:
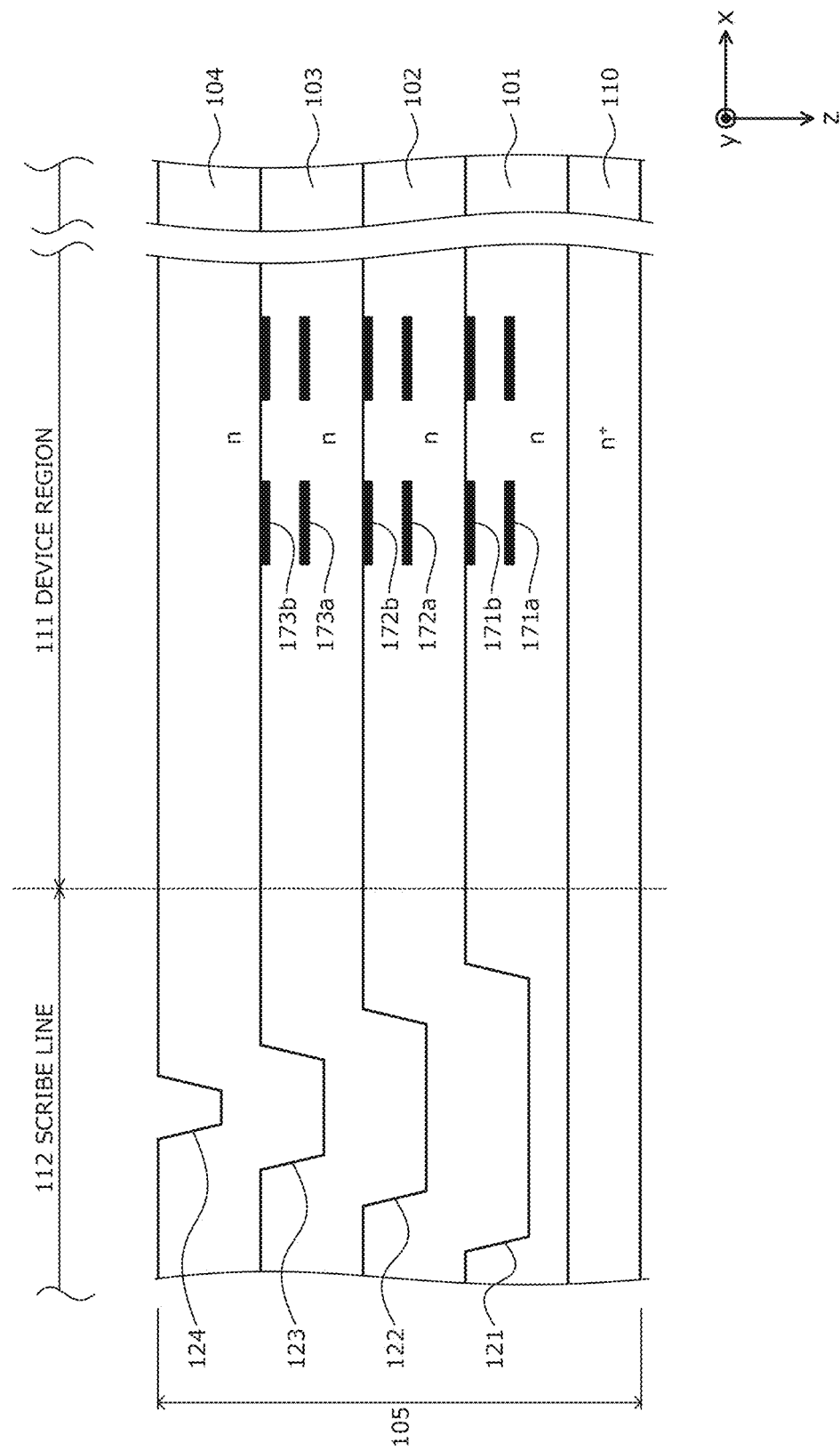
FIG. 27 is a cross-sectional view of the parallel pn layer during formation by the second conventional method.
Figure 28:
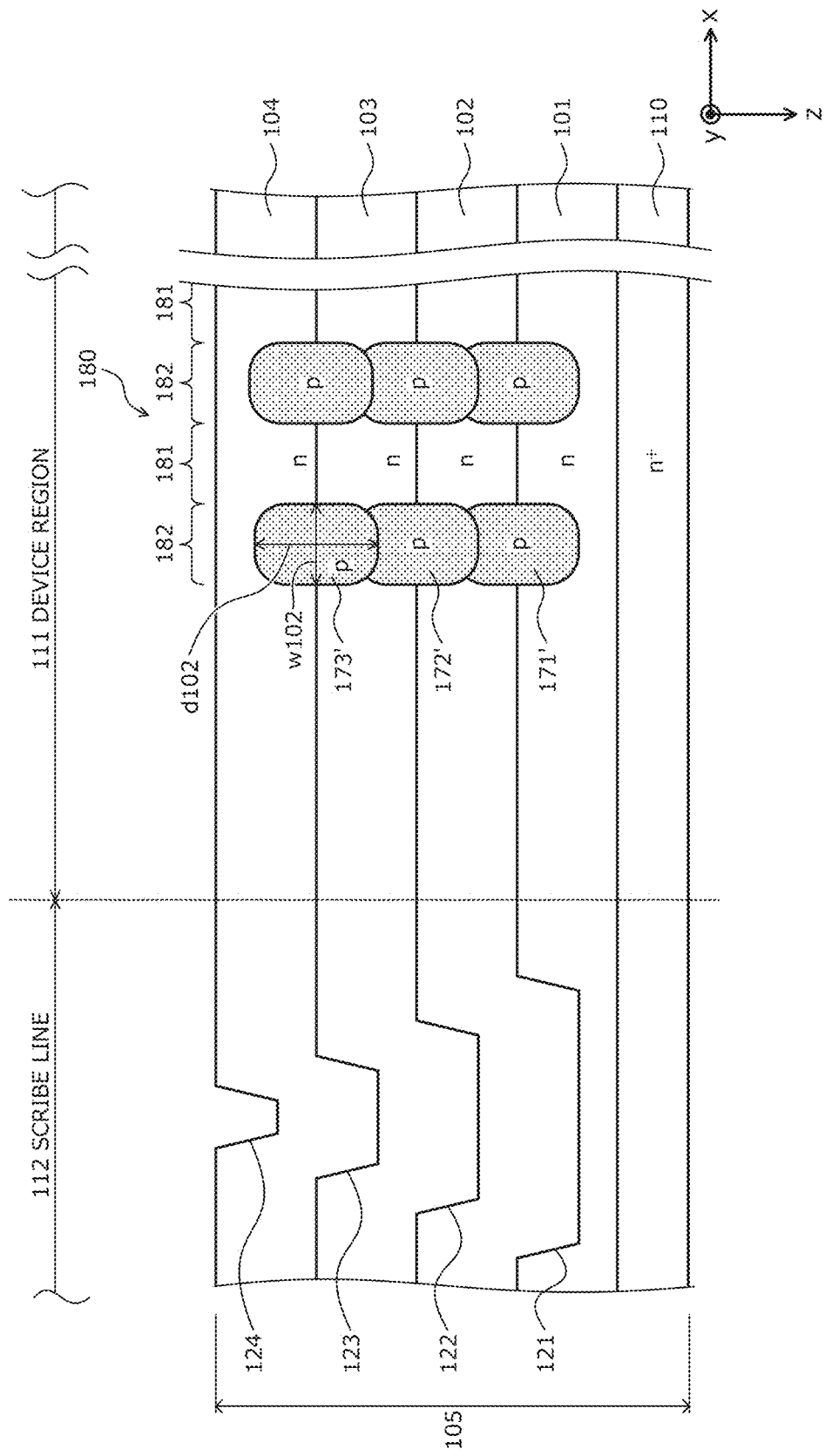
FIG. 28 is a cross-sectional view of the parallel pn layer during formation by the second conventional method.

The deeper are the depths d11 to d13 of the impurity diffusion trenches 31 to 33, the more difficult diffusion along the longitudinal direction becomes for the p-type impurity in the n-type epitaxial layers 1 to 3, and the extent to which diffusion becomes difficult along the longitudinal direction, diffusion of the p-type impurity along the lateral direction is facilitated. Nonetheless, the p-type regions 62 of the parallel pn layer 60 may be formed extending vertically along the longitudinal direction to a greater extent that by the first conventional method (refer to FIG. 23) described above. A reason for this is that in the present invention, the p-type impurity regions 51 to 53 are formed along the inner walls of the impurity diffusion trenches 31 to 33, respectively, whereby diffusion of the p-type impurity in the n-type epitaxial layers 1 to 3 along the longitudinal direction is facilitated as compared to the first conventional method.

Further, after diffusing along the longitudinal direction, the p-type impurity in the n-type epitaxial layers 1 to 3 diffuses along the lateral direction. The p-type impurity that has diffused along the lateral direction uniformly spreads along the lateral direction and the longitudinal direction in portions of the n-type epitaxial layers 2 to 4, the portions that are embedded in the impurity diffusion trenches 31 to 33. Therefore, the impurity concentration of the p-type regions 62 of the parallel pn layer 60 is substantially equal in the lateral direction and the longitudinal direction. Between the parallel pn layer 60 and the n$^+$-type starting substrate 10, and between the front surface of the semiconductor substrate 5 (i.e., the exposed surface of the n-type epitaxial layer 4) and the parallel pn layer 60, a portion of the n-type epitaxial layers uniform along the lateral direction may remain.

In the n-type epitaxial layer 1, a portion thereof that remains uniform along the lateral direction between the parallel pn layer 60 and the n+-type starting substrate 10, for example, functions as an n-type buffer region. In the n-type epitaxial layer 4, in a portion thereof that remains uniform along the lateral direction between the front surface of the semiconductor substrate 5 and the parallel pn layer 60, p-type base regions 71, 81 (refer to FIGS. 7, 8) of a MOS gate structure are formed by ion implantation of a p-type impurity at a subsequent process. Therefore, in the n-type epitaxial layer 4, the portion thereof between the front surface of the semiconductor substrate 5 and the p-type regions 62 of the parallel pn layer 60 may be a p-type by extending the p-type impurity region 53 to the front surface of the semiconductor substrate 5, or may remain the n-type of the n-type epitaxial layer 4.

Further, the n-type regions 61 of the parallel pn layer 60, similarly to the p-type regions 62 of the parallel pn layer 60, may be formed using impurity diffusion trenches. In this case, impurity diffusion trenches are further formed in portions that correspond to formation regions of the n-type regions 61 of the parallel pn layer 60, and an n-type impurity region is formed along an inner wall of the impurity diffusion trenches by ion implantation of an n-type impurity. During the thermal diffusion process, the n-type impurity regions may be further extended along the longitudinal direction and n-type diffusion regions adjacent along the longitudinal direction may be connected, thereby forming the n-type regions 61 of the parallel pn layer 60.

In this manner, when the n-type regions 61 of the parallel pn layer 60, similarly to the p-type regions 62 of the parallel pn layer 60, are formed using impurity diffusion trenches, instead of the n-type epitaxial layers 1 to 3, a non-doped epitaxial layer may be formed by epitaxial growth. A dose amount of the ion implantation of an n-type impurity for forming the n-type impurity regions that constitute the n-type regions 61 of the parallel pn layer 60 suffices to be substantially equal to that of the ion implantation of a p-type impurity for forming the p-type impurity regions 51 to 53 that constitute the p-type regions 62 of the parallel pn layer 60.

The parallel pn layer 60, as viewed from the front surface of the semiconductor substrate 5, may have a striped layout extending along the lateral direction (hereinafter, second direction) y that is orthogonal to the lateral direction (the first direction x) along which the n-type region 61 and the p-type region 62 alternately repeat (refer to FIG. 9). Further, the parallel pn layer 60, as viewed from the front surface of the semiconductor substrate 5, may have a layout in which the p-type regions 62 are disposed forming a matrix-like shape, and the n-type region 61 is disposed so as to surround peripheries of the p-type regions 62 (refer to FIGS. 10, 11).

When the p-type regions 62 are disposed forming a matrix-like shape, a planar shape of the p-type regions 62 may be circular or may be rectangular. Further, when the p-type regions 62 are disposed forming a matrix-like shape, the p-type regions 62 may be disposed so as to be adjacent to each other at substantially equal intervals along the first and the second directions x, y and the n-type region 61 may be disposed forming a grid-like shape surrounding peripheries of the p-type regions 62 (FIG. 10). Alternatively, a row in which the p-type region 62 is disposed at predetermined intervals along the first direction x may be disposed in plural so that the p-type regions 62 are adjacent to each other along the second direction y, in every other row (FIG. 11).

Next, by a general method, the MOS gate structure, an interlayer insulating film, a source electrode, and a drain electrode are formed on a front surface side of the semiconductor substrate 5. As depicted in FIG. 7, the MOS gate structure, when having a planar gate structure, is constituted by a p-type base region 71, an n+-type source region 72, a p+-type contact region 73, a gate insulating film 74, and a gate electrode 75. The p-type base region 71 is selectively provided at positions in the surface layer of the front surface of the semiconductor substrate 5, the positions respectively opposing the p-type regions 62 of the parallel pn layer 60 in the depth direction z and the p-type base regions 71 being in contact with the opposing p-type regions 62.

The n+-type source region 72 and the p+-type contact region 73 are selectively provided in the p-type base region 71. The n+-type source region 72 is provided closer to the gate electrode 75 than is the p+-type contact region 73. The gate electrode 75 is provided, via the gate insulating film 74, on a surface of a region that is between the n-type region 61 of the parallel pn layer 60 and the n+-type source region 72. The gate electrode 75 may extend onto a surface of the n-type region 61 of the parallel pn layer 60, across the gate insulating film 74. The gate electrode 75 is covered by an interlayer insulating film 76.

A source electrode 77 is in contact with the n+-type source region 72 and the p+-type contact region 73, via a contact hole of the interlayer insulating film 76. When an impurity diffusion trench is formed in the surface of the n-type epitaxial layer 4, the impurity diffusion trench functions as a contact trench in which a contact (contact portion) between the source electrode 77 embedded in the impurity diffusion trench and, the p+-type contact region 73 and the n+-type source region 72 exposed at an inner wall of the impurity diffusion trench is formed along the inner wall of the impurity diffusion trench. A drain electrode 78 is provided on an entire rear surface (rear surface of the semiconductor substrate 5) of the n+-type starting substrate 10 that constitutes an n+-type drain region.

As depicted in FIG. 8, the MOS gate structure, when having a trench gate structure, is constituted by a p-type base region 81, a gate trench 82, a gate insulating film 83, a gate electrode 84, a n+-type source region 85, and a p+-type contact region 86. The p-type base region 81 is provided in the surface layer of the front surface of the semiconductor substrate 5 overall in the device region 11 (refer to FIG. 1) and is in contact with the n-type regions 61 and the p-type regions 62 of the parallel pn layer 60. The gate trench 82 penetrates the p-type base region 81 in the depth direction z from the front surface of the semiconductor substrate 5 and reaches the n-type region 61 of the parallel pn layer 60.

In the gate trench 82, the gate electrode 84 is provided via the gate insulating film 83. The n+-type source region 85 and the p+-type contact region 86 are selectively provided in the p-type base region 81. The n+-type source region 85 is provided closer to the gate electrode 84 than is the p+-type contact region 86. The n+-type source region 85 opposes the gate electrode 84, across the gate insulating film 83 at an inner wall of the gate trench 82. The gate electrode 84 is covered by an interlayer insulating film 87.

A source electrode 88 is in contact with the n+-type source region 85 and the p+-type contact region 86, via a contact hole of the interlayer insulating film 87. When an impurity diffusion trench is formed in the surface of the n-type epitaxial layer 4, the impurity diffusion trench functions as a contact trench in which a contact is formed along the inner wall of the impurity diffusion trench, the contact being between the source electrode 88 embedded in the impurity diffusion trench and, the p+-type contact region 86 and the n+-type source region 85 exposed at an inner wall of the impurity diffusion trench. A drain electrode 89 is provided on the entire rear surface (rear surface of the semiconductor substrate 5) of the n+-type starting substrate 10 that constitutes an n+-type drain region.

Thereafter, the semiconductor substrate 5 (semiconductor wafer) is diced (cut) along the scribe line 12 into individual chips, thereby completing a SJ-MOSFET.

As described above, according to the embodiment, at positions in a first n-type epitaxial layer that is stacked first on a starting substrate, the positions corresponding to formation regions of the p-type region of the parallel pn layer, impurity diffusion trenches having a width that is narrower than a width of the p-type regions of the parallel pn layer are formed and by a single ion implantation of a p-type impurity, p-type impurity regions constituting the p-type regions of the parallel pn layer are formed along inner walls of the impurity diffusion trenches. The impurity diffusion trenches have a tapered cross-sectional shape in which the width of the open end is made narrower than the width of the bottom. By forming impurity diffusion trenches in the first n-type epitaxial layer in this manner, thereafter, at positions in the surfaces of a second and subsequent n-type epitaxial layers stacked on the starting substrate, the positions opposing the impurity diffusion trenches of the first n-type epitaxial layer in the depth direction, impurity diffusion trenches may be formed from recesses that occur having dimensions that correspond to dimensions (the width of the open end, the width and depth of the bottom) of the impurity diffusion trenches of the first n-type epitaxial layer.

Therefore, according to the embodiment, in the ion implantation of a p-type impurity performed once with each stacking of the second and subsequent n-type epitaxial layers, the p-type impurity regions that constitute the p-type regions of the parallel pn layer may be formed along the inner walls of the impurity diffusion trenches of the respectively corresponding n-type epitaxial layers. In this manner, in each of the n-type epitaxial layers stacked on the starting substrate, the p-type impurity region is formed along the inner walls of the impurity diffusion trenches, whereby as compared to the first conventional method of forming in the surface layer of the n-type epitaxial layer by a single ion implantation of a p-type impurity, the p-type impurity regions that constitute the p-type regions of the parallel pn layer, at the thermal diffusion process, the p-type impurity regions be extended deeper along the longitudinal direction and extension of the p-type impurity regions in the lateral direction may be suppressed. As a result, the parallel pn layer may be formed by p-type regions that have a high aspect ratio and extend vertically along the longitudinal direction, the p-type regions being formed by connecting, along the longitudinal direction, the p-type diffusion regions that are formed by thermal diffusion of the p-type impurity regions along the longitudinal direction. Therefore, the tradeoff relationship between the breakdown voltage and the ON resistance may be improved.

Figure 12:
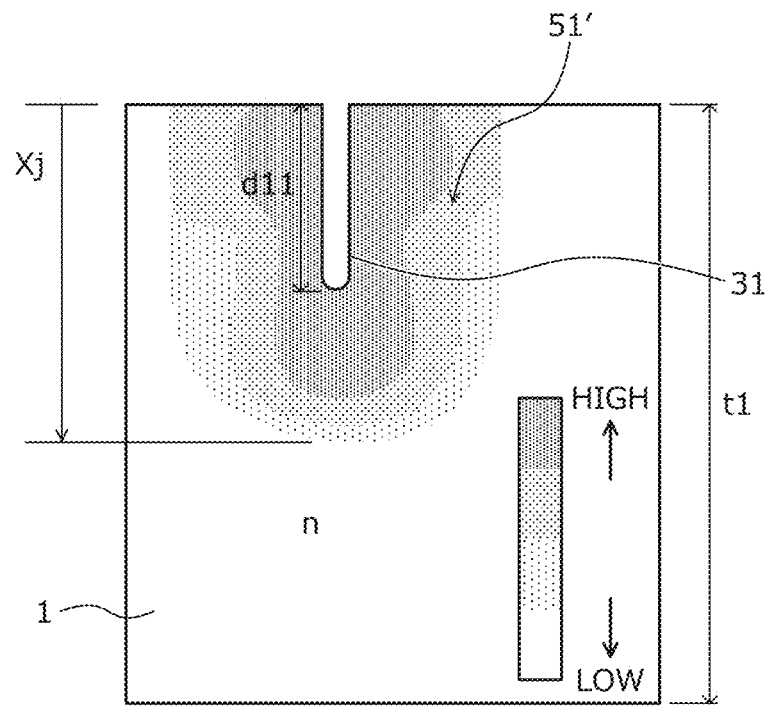
FIG. 12 is a characteristics diagram depicting results of simulation of a p-type impurity concentration profile after a thermal diffusion process of p-type impurity regions that are formed along inner walls of impurity diffusion trenches, in a first example.
Figure 13:
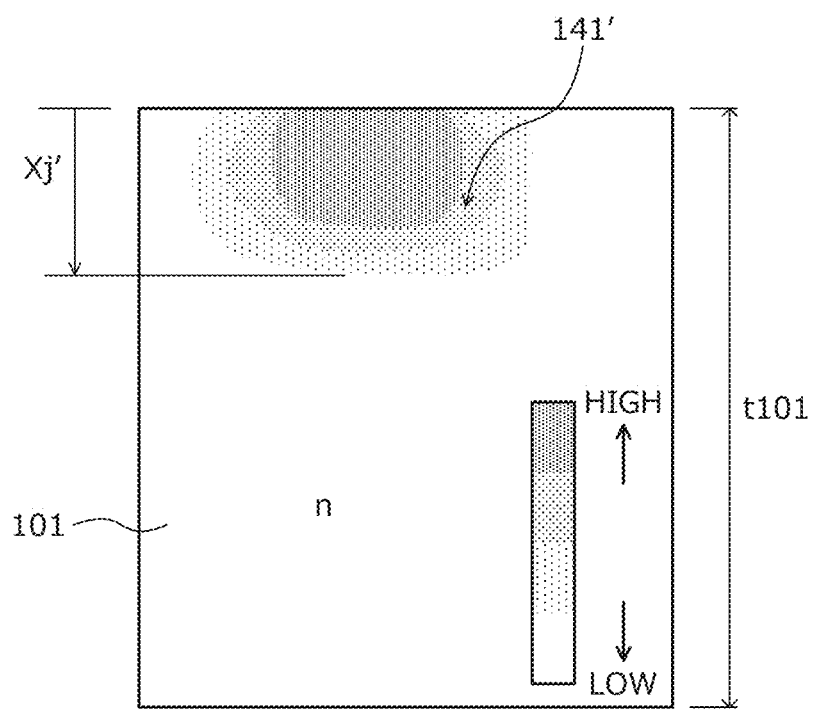
FIG. 13 is a characteristics diagram depicting results of simulation of a p-type impurity concentration profile after the thermal diffusion process of the p-type impurity regions in a first conventional example.
Figure 14:
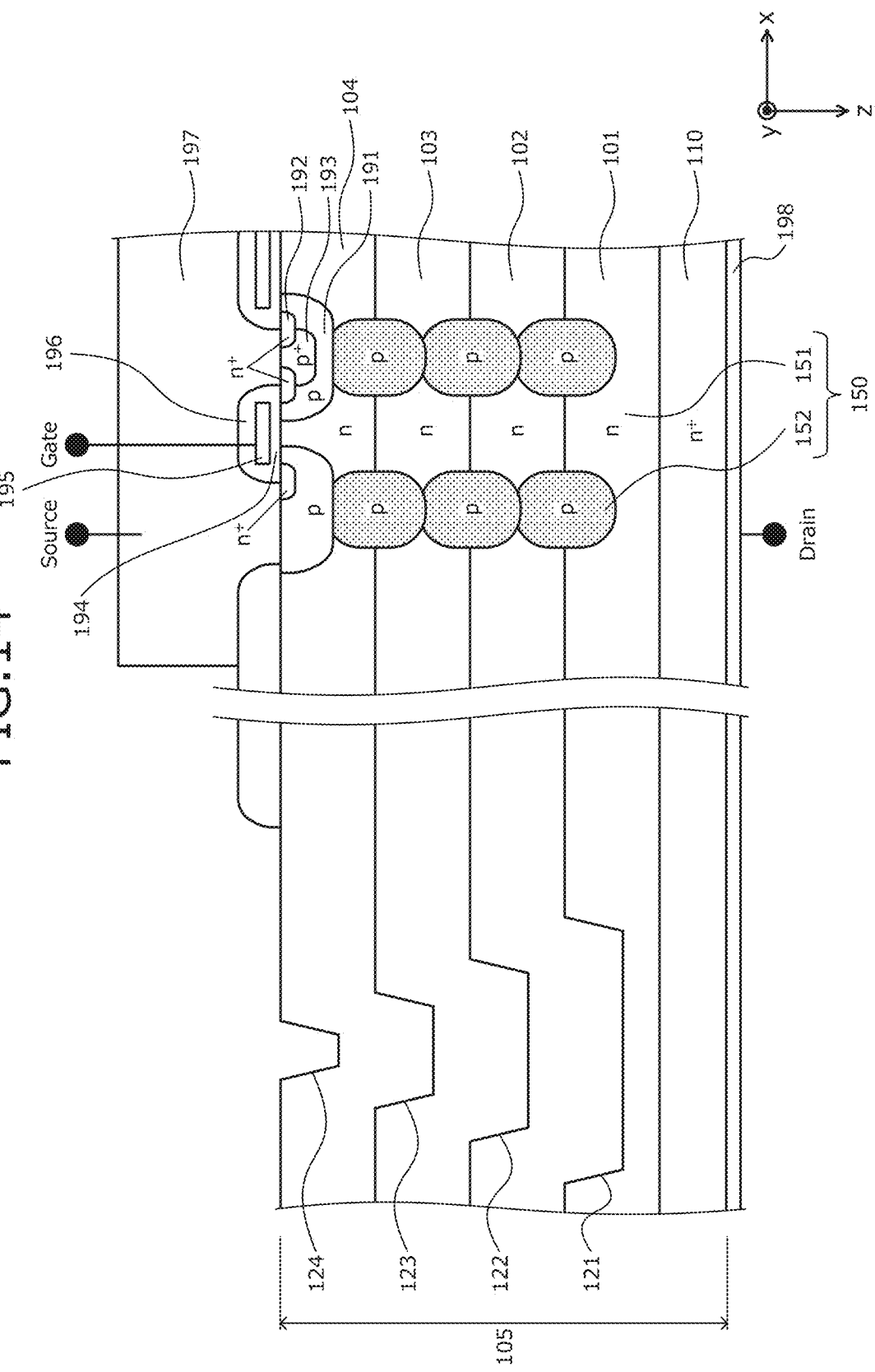
FIG. 14 is a cross-sectional view of a structure of a semiconductor device of the first conventional example.

Verification of the diffusion depth dl of the p-type diffusion regions 51' to 53' that are formed by extending, by the thermal diffusion process, the p-type impurity regions 51 to 53 that are formed along the inner walls of the impurity diffusion trenches 31 to 33 will be described. FIG. 12 is a characteristics diagram depicting results of simulation of a p-type impurity concentration profile after the thermal diffusion process of the p-type impurity regions that are formed along the inner walls of the impurity diffusion trenches, in the first example. FIG. 13 is a characteristics diagram depicting results of simulation of a p-type impurity concentration profile after the thermal diffusion process of the p-type impurity regions in a first conventional example. FIG. 14 is a cross-sectional view of a structure of a semiconductor device of the first conventional example.

FIG. 12 depicts results of simulation of a p-type impurity concentration profile obtained by the p-type diffusion region 51' that is formed according to the described method of manufacturing a semiconductor device according to the embodiment where the ion implantation 42 of boron as the p-type impurity is performed, forming the p-type impurity region 51 along the inner wall of the impurity diffusion trench 31 in the n-type epitaxial layer 1 and thereafter, the p-type impurity region 51 is extended by the thermal diffusion process, thereby forming the p-type diffusion region 51' (hereinafter, first example). In FIG. 12, hatched portions are the p-type diffusion region 51'.

For comparison, FIG. 13 depicts results of simulation of a p-type impurity concentration profile obtained by the p-type diffusion region 141' that is formed using the first conventional method where the p-type impurity region 141 is formed in the surface layer of the front surface of the n-type epitaxial layer 101 by the ion implantation 132 of a p-type impurity and thereafter, the p-type impurity region 141 is extended by the thermal diffusion process, thereby forming the p-type diffusion region 141' (hereinafter, first conventional example). Other than no formation of an impurity diffusion trench, conditions are identical to those of the first example. In FIG. 13, hatched portions are the p-type diffusion region 141'.

From the results depicted in FIGS. 12 and 13, it was confirmed that in contrast to the formation of the p-type diffusion region 141' that extended along the lateral direction in the first conventional example, in the first example, extension of the p-type impurity region 51 along longitudinal direction was possible near the bottom of the impurity diffusion trench 31, and a diffusion depth Xj thereof could be made deeper along the longitudinal direction than a diffusion depth Xj' of the p-type diffusion region 141' of the first conventional example. As a result, it was confirmed that in the first example, the p-type region 62 that is formed by connecting the p-type diffusion regions 51' to 53' could be extended to a greater extent along the longitudinal direction as compared to the first conventional example. In other words, a width (width of a current path) of the n-type region 61 of the parallel pn layer 60 is substantially uniform along the longitudinal direction.

In particular, in the first example, as depicted in FIG. 7, a pn junction surface of the p-type region 62 that is formed by connecting the p-type diffusion regions 51' to 53' and of a region between adjacent p-type regions 62 (i.e., the n-type region 61) was confirmed to be substantially vertical with respect to the front surface of the semiconductor substrate 5. In contrast, as depicted in FIG. 14, in the first conventional example, a pn junction surface of the p-type region 152 that is formed by connecting the p-type diffusion regions 141' to 143' and of a region (i.e., the n-type region 151) between adjacent p-type regions 152 was confirmed to have a wavy state. In other words, a width (width of a current path) of the n-type region 151 of the parallel pn layer 150 decreases at certain locations.

The MOS gate structure of the first conventional example depicted in FIG. 14 is a planar gate structure similar to that of the first example depicted in FIG. 7. In other words, configuration of a p-type base region 191, an n+-type source region 192, a p+-type contact region 193, a gate insulating film 194, a gate electrode 195, an interlayer insulating film 196, a source electrode 197, and a drain electrode 198 of the first conventional example is similar to that of the p-type base region 71, the n⁺-type source region 72, the p⁺-type contact region 73, the gate insulating film 74 and the gate electrode 75, the interlayer insulating film 76, the source electrode 77, and the drain electrode 78 of the first example.

Further, simulation results substantially similar to the first example were also obtained for the p-type diffusion regions formed along the inner walls of the impurity diffusion trenches of the second and subsequent n-type epitaxial layers deposited on the n-type epitaxial layer 1. Further, the diffusion depth Xj of the p-type diffusion region 51' of the first example is a diffusion depth from the exposed surface of the n-type epitaxial layer 1 and in the described method of manufacturing a semiconductor device according to the embodiment, corresponds to a depth that is substantially half of the diffusion depth dl of the p-type diffusion regions 51' to 53' after the thermal diffusion process that is performed after the n-type epitaxial layer 4 is deposited.

Here, while the thickness t1, t101 of the n-type epitaxial layers 1, 101 were assumed to be 4.0 μm. Further, the width w11 of the open end of the impurity diffusion trenches 31 was assumed to be 0.8 μm, the depth d11 of the impurity diffusion trench 31 was assumed to be 1.5 μm, and the angle θ formed by the side wall of the impurity diffusion trench 31 and the extended line of the bottom of the impurity diffusion trench 31 was assumed to be 87°, the inventor confirmed that provided dimensions of the impurity diffusion trenches 31 are within the ranges described above, effects similar to those of the example are obtained.

Figure 15:
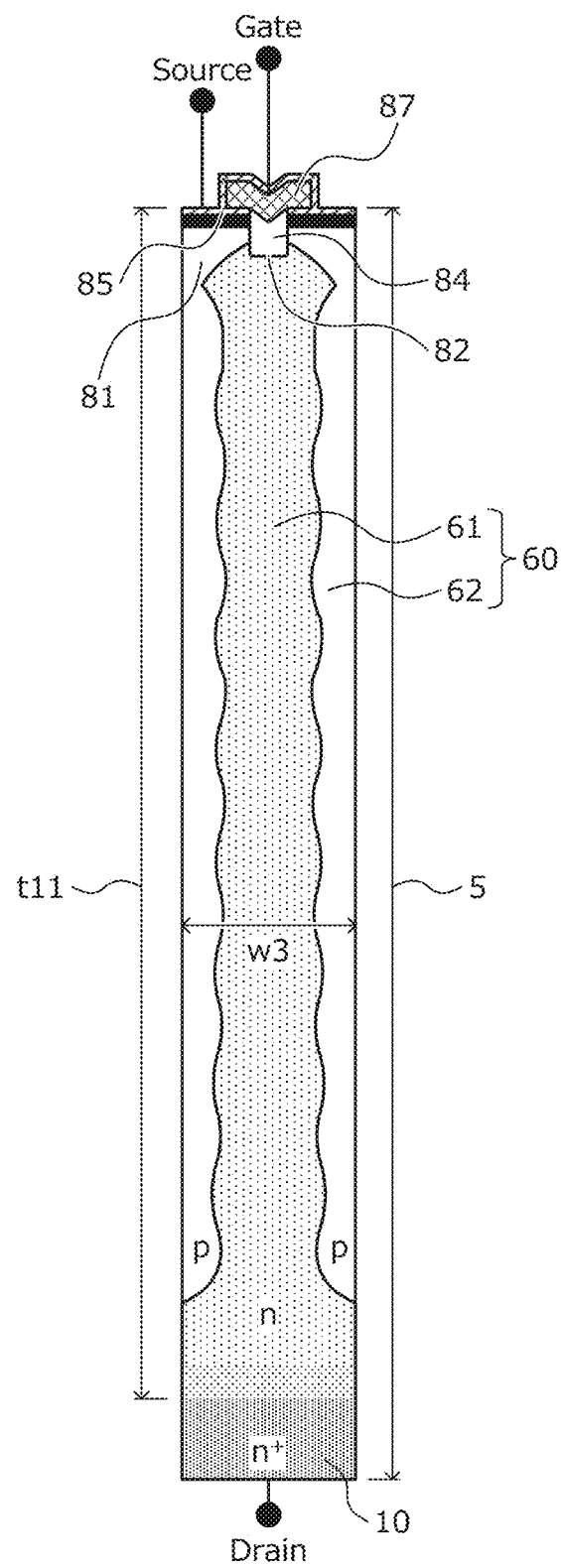
FIG. 15 is a cross-sectional view of a technology computer-aided design (TOAD) simulation model of a semiconductor device according to a second example.
Figure 16:
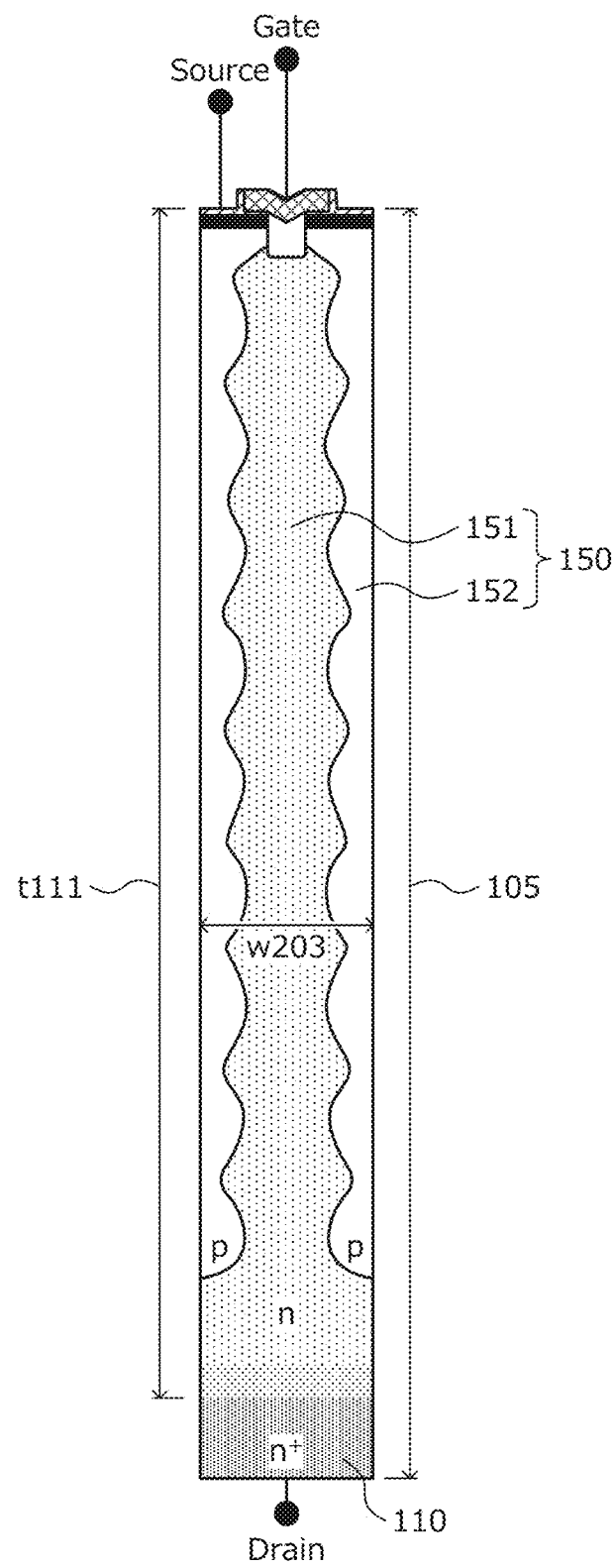
FIG. 16 is a cross-sectional view of a TOAD simulation model of a semiconductor device of a second conventional example.
Figure 17:
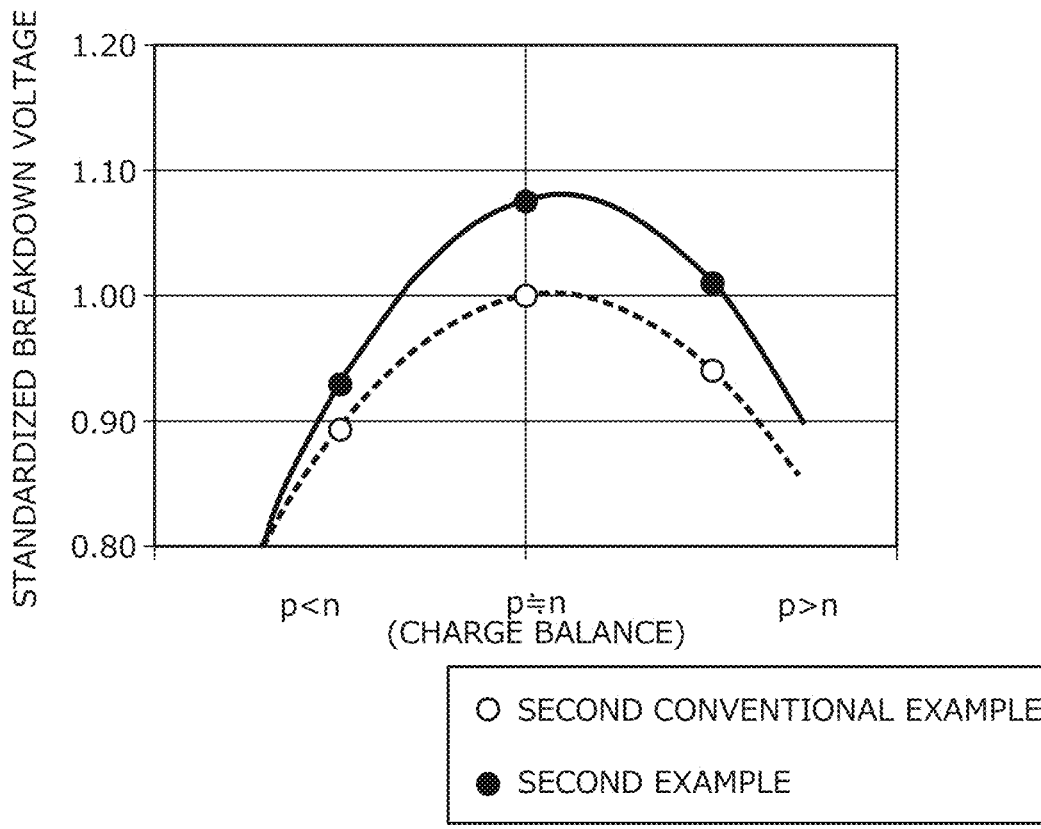
FIG. 17 is a characteristics diagram depicting a relationship between charge balance and breakdown voltage of a parallel pn layer of the second conventional example.
Figure 18:
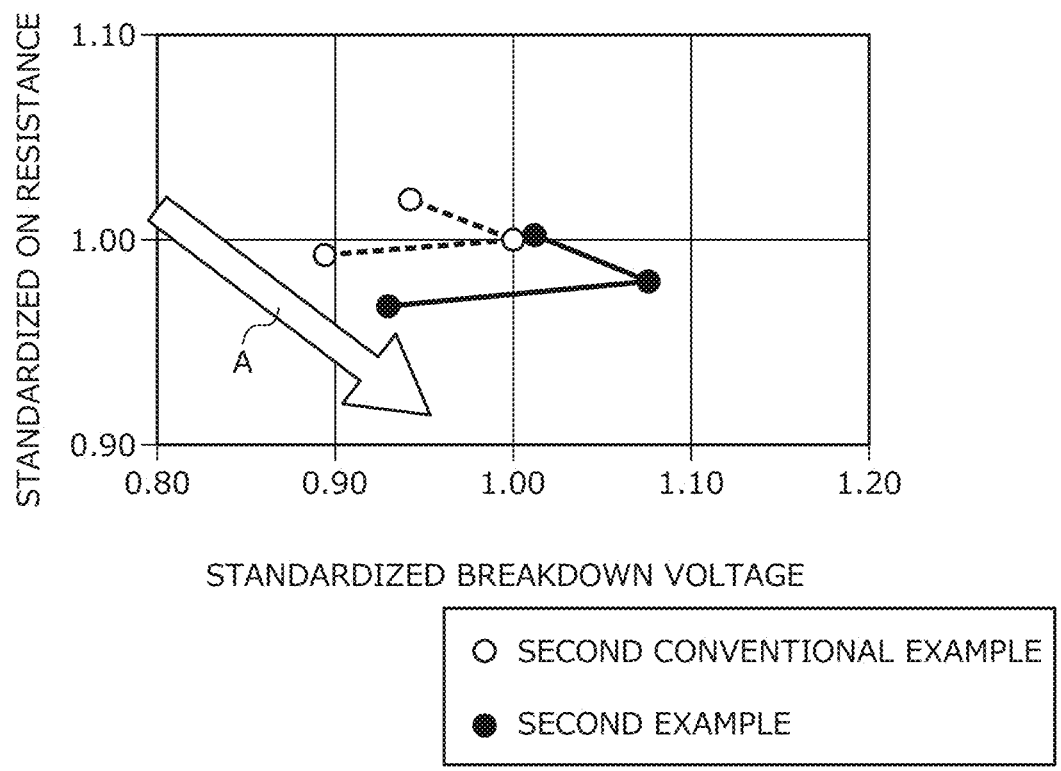
FIG. 18 is a characteristics diagram depicting a relationship between breakdown voltage and ON resistance of the second conventional example.
Figure 19:
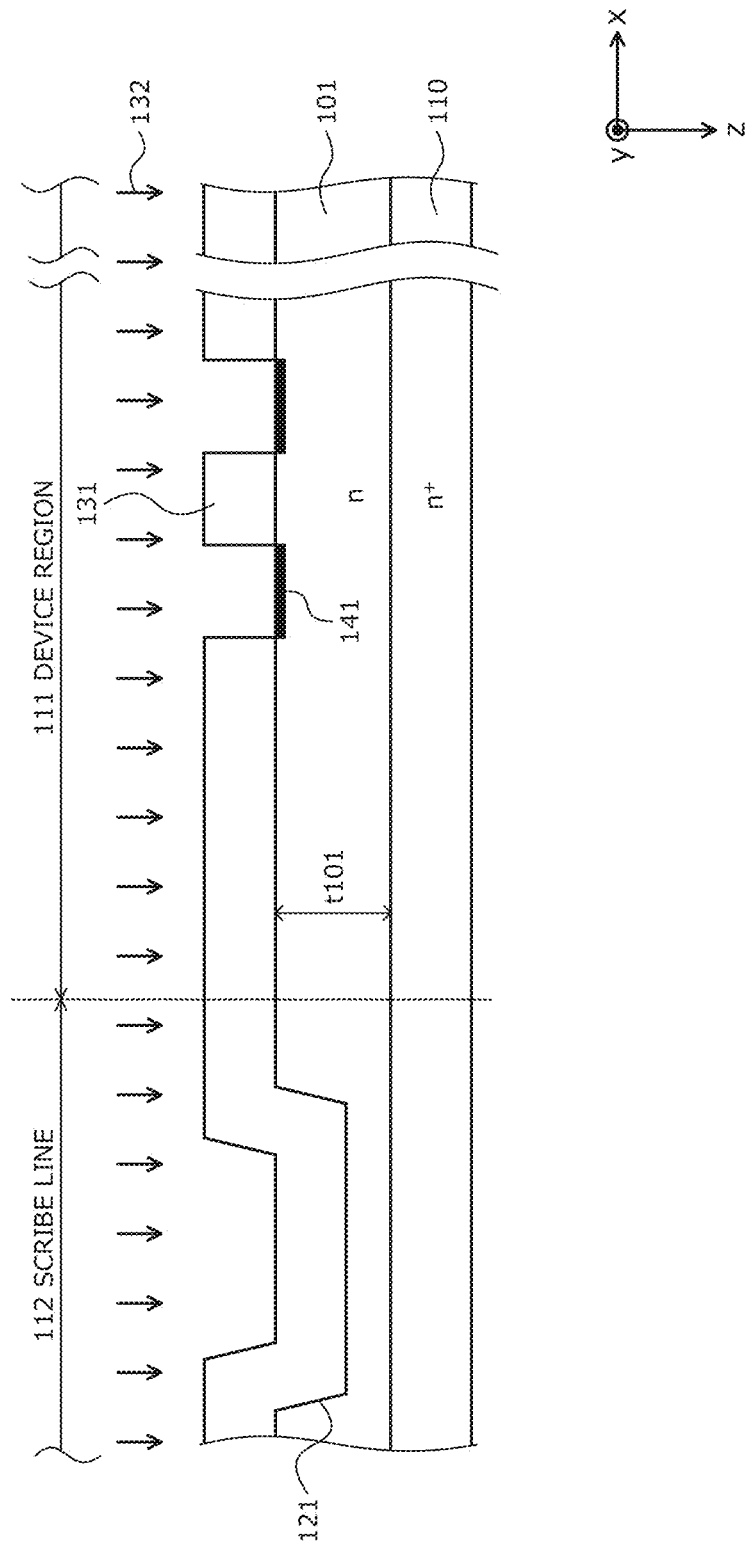
FIG. 19 is a cross-sectional view of the parallel pn layer during formation by the first conventional method.
Figure 20:
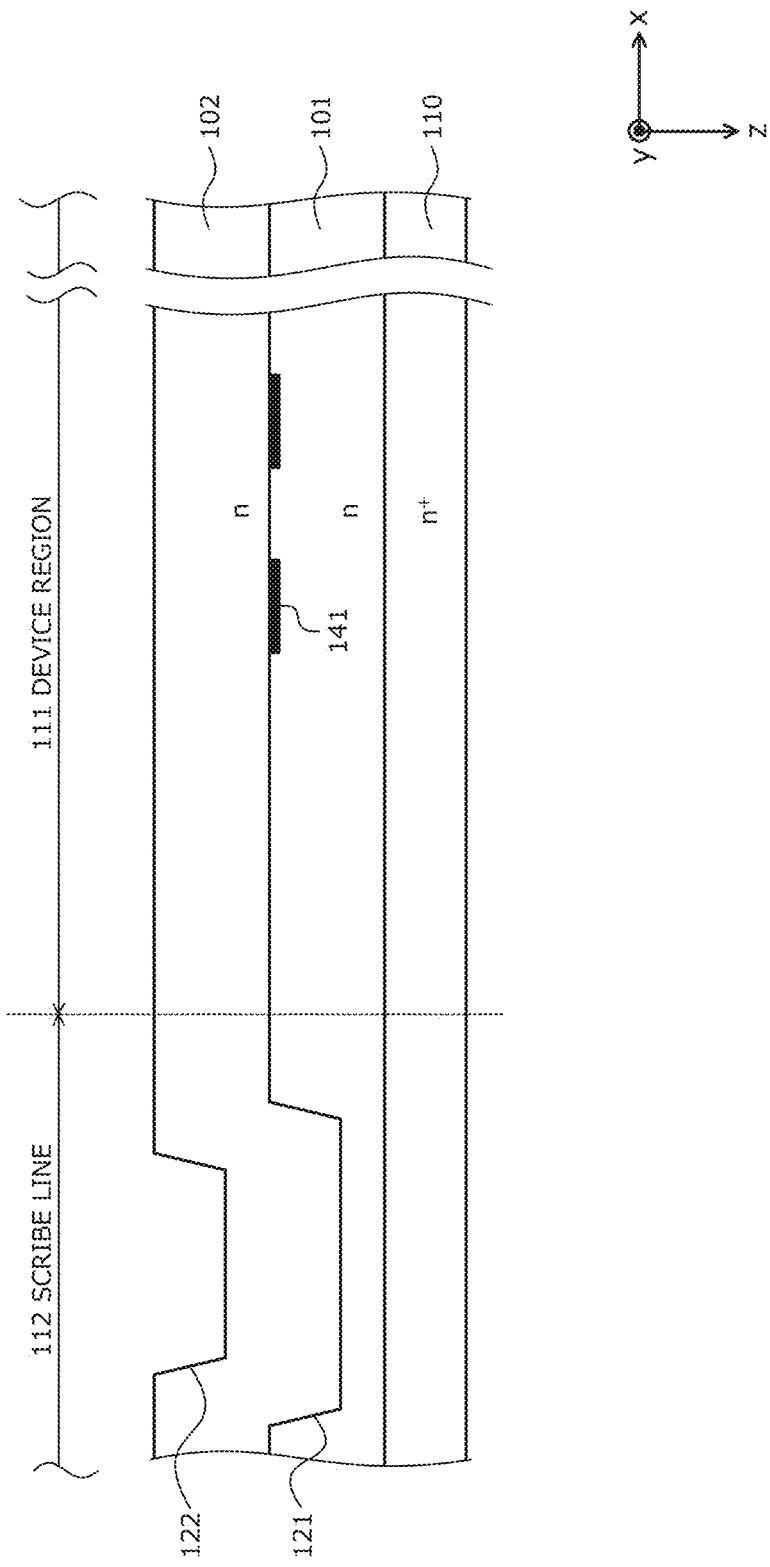
FIG. 20 is a cross-sectional view of the parallel pn layer during formation by the first conventional method.
Figure 21:
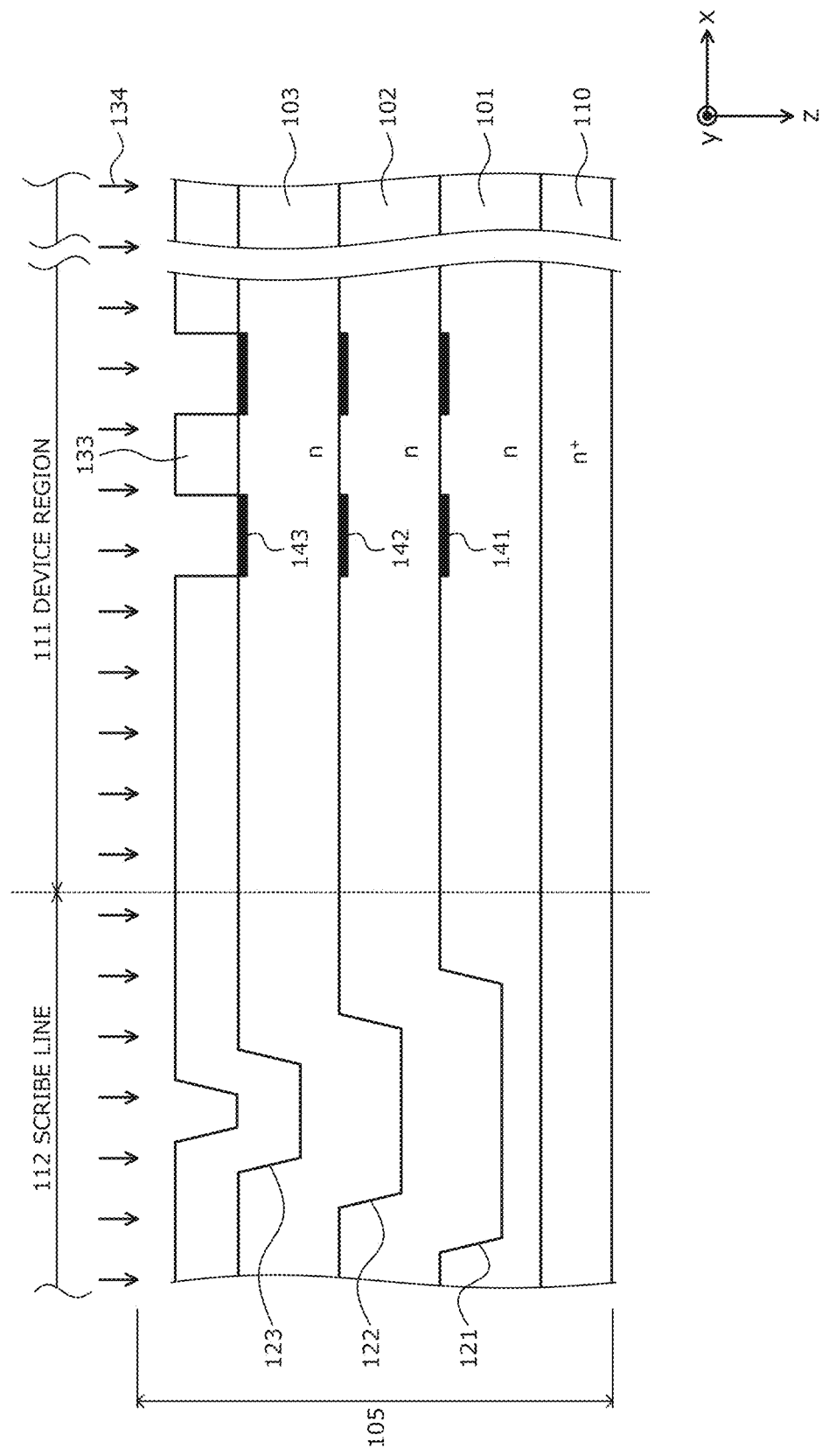
FIG. 21 is a cross-sectional view of the parallel pn layer during formation by the first conventional method.
Figure 22:
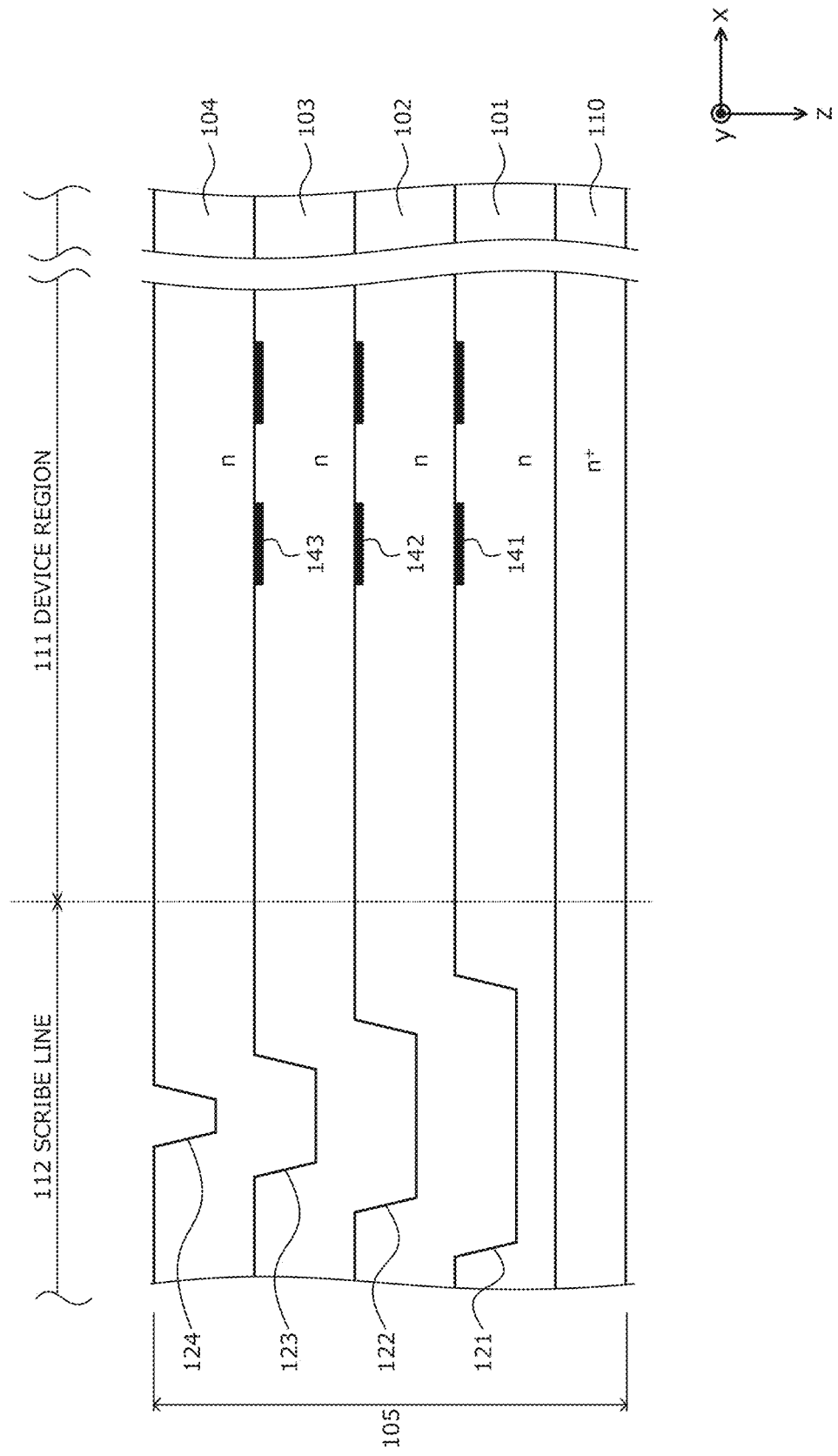
FIG. 22 is a cross-sectional view of the parallel pn layer during formation by the first conventional method.

A relationship between charge balance, breakdown voltage, and ON resistance of the parallel pn layer 60 was verified. FIG. 15 is a cross-sectional view of a technology computer-aided design (TOAD) simulation model of a semiconductor device according to a second example. FIG. 16 is a cross-sectional view of a TOAD simulation model of a semiconductor device of a second conventional example. FIG. 17 is a characteristics diagram depicting a relationship between charge balance and breakdown voltage of a parallel pn layer of the second conventional example. FIG. 18 is a characteristics diagram depicting a relationship between breakdown voltage and ON resistance of the second conventional example.

In FIGS. 15 and 16, the gate insulating film, the source electrode, and the drain electrode are not depicted. In FIG. 17, a center of a horizontal axis is charge balance of the n-type region and the p-type region of the parallel pn layer. On a vertical axis in FIG. 17 and a horizontal axis in FIG. 18, breakdown voltage is shown that is standardized assuming breakdown voltage to be 1.00 when the n-type region 151 and the p-type region 152 of the parallel pn layer 150 of the second conventional example are in a state of charge balance. On a vertical axis in FIG. 18, ON resistance is shown that is standardized assuming ON resistance to be 1.00 when the n-type region 151 and the p-type region 152 of the parallel pn layer 150 of the second conventional example are in state of charge balance.

FIG. 15 depicts a TOAD simulation model (refer to FIGS. 6, 8; hereinafter, second example) of the parallel pn layer 60 of a trench gate MOSFET that has a structure of a semiconductor device fabricated according to the described method of manufacturing a semiconductor device according to the embodiment. In the second example, in the semiconductor substrate 5, nine n-type epitaxial layers in which formation of impurity diffusion trenches and ion implantation of a p-type impurity are performed, and one epitaxial layer that is the most superficial layer and in which the ion implantation of a p-type impurity is not performed are assumed to be stacked on the n⁺-type starting substrate 10.

The repeat pitch w3 of the p-type region 62 of the parallel pn layer 60 is assumed to be 6 μm, a thickness (i.e., total thickness of ten layers of the n-type epitaxial layer) t11 of an epitaxial layer portion of the semiconductor substrate 5 is assumed to be 45 μm. In the second example, similarly to the first example, the width of the n-type region 61 of the parallel pn layer 60 is uniform along the longitudinal direction.

For comparison, a TOAD simulation model (refer to FIG. 23; hereinafter, second conventional example) of the parallel pn layer 150 of a trench gate MOSFET that has a structure of a semiconductor device fabricated by the first conventional method is depicted in FIG. 16. In the second conventional example, a stacked layer count of the n-type epitaxial layers constituting the semiconductor substrate 105, the MOS gate structure, a repeat pitch w203 of the p-type region 152 of the parallel pn layer 150, and a thickness (i.e., the total thickness of ten layers of the n-type epitaxial layer) t111 of an epitaxial layer portion of the semiconductor substrate 105 are similar to those in the second example. In the second conventional example, similarly to the first conventional example, the width of the n-type region 151 of the parallel pn layer 150 decreases at certain locations.

From the results depicted in FIG. 17, it was confirmed that the second example, in both a charge balance state and a charge unbalance state, was able to improve the breakdown voltage to a greater extent than the second conventional example for which an average impurity amount difference of the n-type region and the p-type region of the parallel pn layer was the same condition. In FIG. 17, in both the second example and the second conventional example, of three data points, a center data point (p-type impurity amount≈n-type impurity amount; in FIG. 17, "p≈n") is a charge balance state while a left-side data point (p-type impurity amount<n-type impurity amount; in FIG. 17, "p<n") and a right-side data point (p-type impurity amount>n-type impurity amount; in FIG. 17, "p>n") are charge unbalance states.

From the results depicted in FIG. 18, it was confirmed that the second example, in both the charge balance state and the charge unbalance state, was able to improve the tradeoff relationship between breakdown voltage and ON resistance to a greater extent than the second conventional example for which the average impurity amount difference of the n-type region and the p-type region of the parallel pn layer was the same condition. In FIG. 18, a direction indicated by arrow A is a direction in which the tradeoff relationship between breakdown voltage and ON resistance is improved.

Charge balance is an instance where the average impurity amounts of the n-type regions and the p-type regions of the parallel pn layer are substantially equal. Charge unbalance is an instance where the average impurity amounts of the n-type regions and the p-type regions of the parallel pn layer differ. While not depicted, also in a planar gate MOSFET having a structure of a semiconductor device that is fabricated according to the described method of manufacturing a semiconductor device according to the embodiment, effects similar to those of the second example are obtained.

In the foregoing, the present invention, without limitation to the embodiment, may be various modified within a range not departing from the spirit of the invention. For example, in the embodiment above, while a case in which the widths of the n-type regions and the p-type regions of the parallel pn layer are assumed to be equal was described as an example, the widths of the n-type regions and the p-type regions of the parallel pn layer may differ. When the widths of the n-type regions and the p-type regions of the parallel pn layer differ, for example, a charge balance state may be achieve by setting the respective impurity concentrations so that the average impurity amounts of the n-type regions and the p-type regions of the parallel pn layer become substantially equal.

Further, in the present invention, the n-type epitaxial layer that are stacked on the starting substrate may each have a different thickness, and an n-type epitaxial layer that constitutes an n-type buffer layer between the starting substrate and the n-type epitaxial layers forming the parallel pn layer may be stacked. Further, in the present invention, silicon (Si) or silicon carbide (SiC) may be used as a semiconductor material. With silicon carbide, diffusion of the impurity is difficult and when silicon carbide is used as the semiconductor material, for example, a process period of the thermal diffusion process that is performed to extend, along the longitudinal direction, impurity regions that become the p-type regions (or the n-type regions and the p-type regions) of the parallel pn layer may be shortened.

Further, as a dopant of the ion implantation for forming the p-type regions of the parallel pn layer, a general accepter such as boron or aluminum (Al), etc. is used. As a dopant of the ion implantation for forming the n-type regions of the parallel pn layer and as a dopant that is doped when the n-type epitaxial layers are formed by epitaxial growth, a general donor such as phosphorus (P) or arsenic (As), etc. is used. Further, the present invention is further implemented when conductivity types (n-type, p-type) are reversed.

According to the method of manufacturing a semiconductor device of the present invention, in the method of manufacturing a semiconductor device having a parallel pn layer, as a p-type region (second-conductivity-type region) of the parallel pn layer, a p-type region may be formed that has a high aspect ratio and that extends vertically along the longitudinal direction. Therefore, an effect may be achieved in that the tradeoff relationship between breakdown voltage and ON resistance is improved.

As described, the method of manufacturing a semiconductor device according to the present invention is useful for super junction semiconductor devices having a parallel pn layer fabricated by a multistage epitaxial method.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of manufacturing a semiconductor device having a parallel pn layer in which a plurality of first-conductivity-type regions alternate with a plurality of second-conductivity-type regions in a direction parallel to a surface of a semiconductor substrate, the method comprising:
    preparing the semiconductor substrate;
    epitaxially growing a first first-conductivity-type epitaxial layer on the semiconductor substrate;
    forming a plurality of first trenches, each of which reaches a predetermined depth measured from a surface of the first first-conductivity-type epitaxial layer;
    implanting second-conductivity-type impurity ions in each of the first trenches to respectively form a plurality of first second-conductivity-type impurity regions therein;
    epitaxially growing a second first-conductivity-type epitaxial layer on the first first-conductivity-type epitaxial layer including inner walls of the first trenches, whereby the second first-conductivity-type epitaxial layer has a plurality second trenches respectively formed over corresponding ones of the first trenches;
    implanting the second-conductivity-type impurity ions in the second trenches to form the second second-conductivity-type impurity regions; and
    diffusing the second-conductivity-type impurity ions into the first second-conductivity-type impurity regions and the second second-conductivity-type impurity regions by performing a heat treatment, thereby connecting each of the first second-conductivity-type impurity regions to a corresponding one of the second second-conductivity-type impurity regions in a depth direction,
    wherein
    the implanting the second-conductivity-type impurity ions in the first trenches includes:
        forming on the first first-conductivity-type epitaxial layer, a first mask having openings each of which has a width greater than a width of each of the first trenches, the first mask exposing the first trenches; and
        implanting the second-conductivity-type impurity ions along the inner walls of the first trenches using the first mask to form the first second-conductivity-type impurity regions, and
    the implanting the second-conductivity-type impurity ions in the second trenches includes:
        forming on the second first-conductivity-type epitaxial layer, a second mask having openings, each of which has a width greater than a width of each of the second trenches, the second mask exposing the second trenches; and
        implanting the second-conductivity-type impurity ions along inner walls of the second trenches using the second mask to form the second second-conductivity-type impurity regions.

2. The method according to claim 1, wherein forming the plurality of first trenches includes forming the first trenches by dry etching.

3. The method according to claim 2, wherein each of the plurality of first trenches has an open end having a width narrower than a width of a bottom thereof.

4. The method according to claim 1, wherein
    each of the first first-conductivity-type epitaxial layer and the second first-conductivity-type epitaxial layer has the parallel pn layer, and
    in the first first-conductivity-type epitaxial layer, the plurality of second-conductivity-type regions is the plurality of the first second-conductivity-type regions, and the first-conductivity-type regions are respectively constituted by a portion of the first first-conductivity-type epitaxial layer sandwiched by a corresponding two adjacent first second-conductivity-type regions, and
    in the second first-conductivity-type epitaxial layer, the plurality of second-conductivity-type regions is the plurality of the second second-conductivity-type regions, and the first-conductivity-type regions are respectively constituted by a portion of the second first-conductivity-type epitaxial layer sandwiched by a corresponding two adjacent second second-conductivity-type regions.

5. The method according to claim 1, further comprising forming an other trench as an alignment mark in a region surrounding a periphery of a device region in which the parallel pn layer is formed, wherein the plurality of first trenches is formed in the device region.

6. The method according to claim 1, wherein forming the plurality of second trenches includes forming the second trenches by dry etching.

7. The method according to claim 6, wherein each of the plurality of second trenches has an open end having a width narrower than a width of a bottom thereof.

\* \* \* \* \*